(12) United States Patent
Hayashi et al.

(10) Patent No.: US 6,545,611 B2
(45) Date of Patent: Apr. 8, 2003

(54) TRANSMISSION APPARATUS

(75) Inventors: Mitsuaki Hayashi, Osaka (JP);
Toshiaki Asai, Osaka (JP); Hiroshi Kato, Hyogo (JP); Kazuya Nishida, Osaka (JP); Katsuhiko Ikeda, Osaka (JP); Yoshiyuki Sato, Osaka (JP); Kazuo Fujita, Osaka (JP); Takaharu Izuno, Osaka (JP); Kazutaka Nakata, Osaka (JP); Kouichi Nakamura, Osaka (JP)

(73) Assignee: Fujitsu Limited, Kawasaki (JP)

( * ) Notice: Subject to any disclaimer, the term of this patent is extended or adjusted under 35 U.S.C. 154(b) by 18 days.

(21) Appl. No.: 09/952,192

(22) Filed: Sep. 14, 2001

(65) Prior Publication Data

US 2002/0145858 A1 Oct. 10, 2002

(30) Foreign Application Priority Data

Apr. 6, 2001 (JP) ........................................ 2001-108911

(51) Int. Cl.[7] .............................................. G08B 21/00
(52) U.S. Cl. ................................ 340/686.4; 340/686.5; 340/686.2; 340/691.1; 361/798; 361/799; 361/802
(58) Field of Search ........................... 340/686.4, 686.5, 340/686.2, 691.1, 310.01; 361/798, 799, 802, 724, 736

(56) References Cited

U.S. PATENT DOCUMENTS

| | | | | |
|---|---|---|---|---|
| 4,760,375 A | * | 7/1988 | Stecker | 340/310 A |
| 4,850,044 A | * | 7/1989 | Block et al. | 455/607 |
| 5,343,361 A | * | 8/1994 | Rudy, Jr. et al. | 361/710 |

* cited by examiner

*Primary Examiner*—Daniel J. Wu
*Assistant Examiner*—Hung Nguyen
(74) *Attorney, Agent, or Firm*—Katten Muchin Zavis Rosenman

(57) ABSTRACT

A transmission apparatus with flexible structure for introducing external cables that controls signal transmission efficiently. A cable connector for introducing a cable from the outside is fixed on a sub-printed circuit board. A main printed circuit board has a guide rail along which the sub-printed circuit board can be inserted reversely to change the direction from which the cable is introduced at the time of the sub-printed circuit board being housed. An enclosure has ducts for bunching cables. Transmission units are mounted in the enclosure.

20 Claims, 31 Drawing Sheets

FIG. 3(A)
STATE A
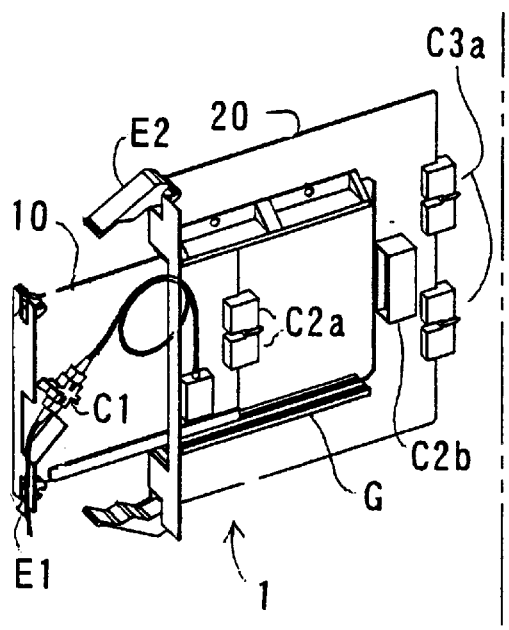
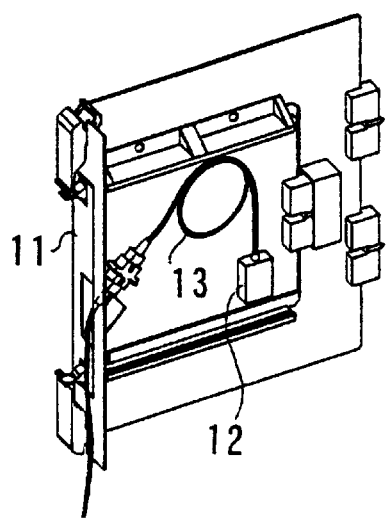
FIG. 3(B)
STATE B
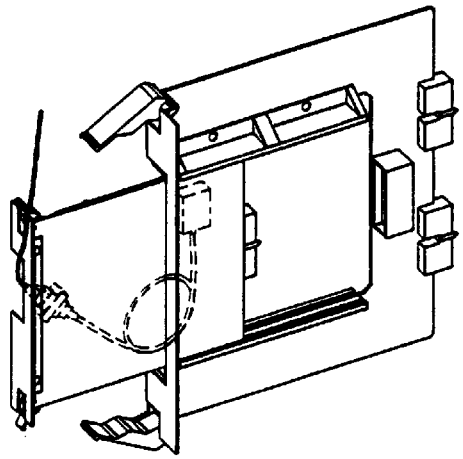
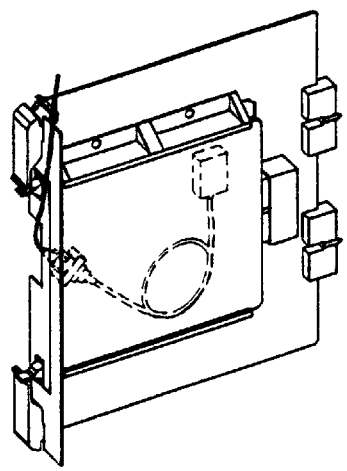

FIG. 4(A)
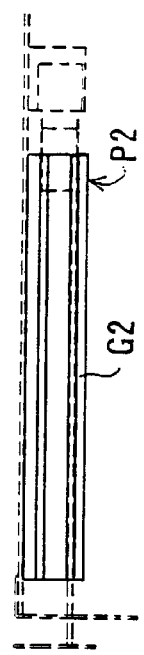
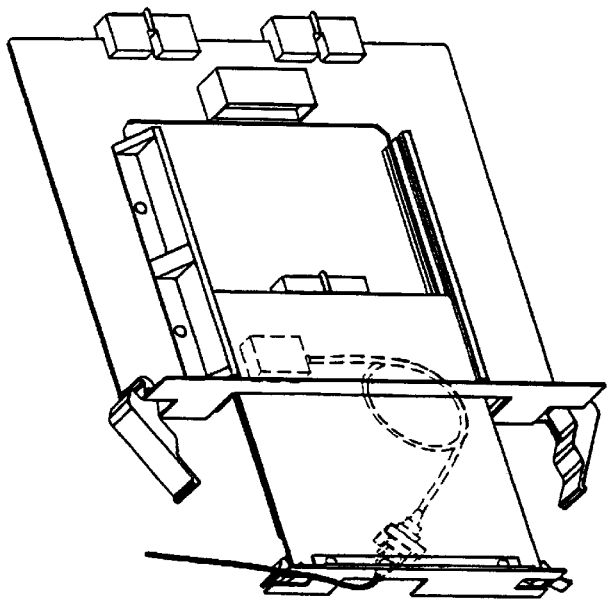
FIG. 4(B)
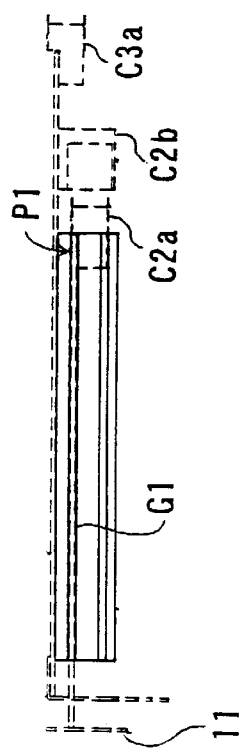
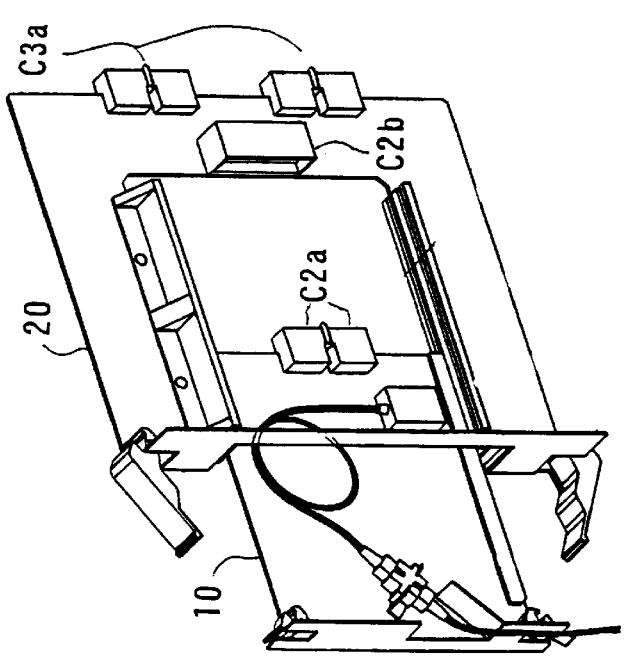

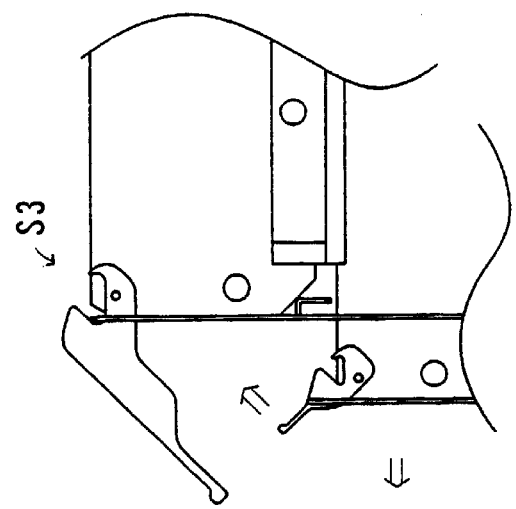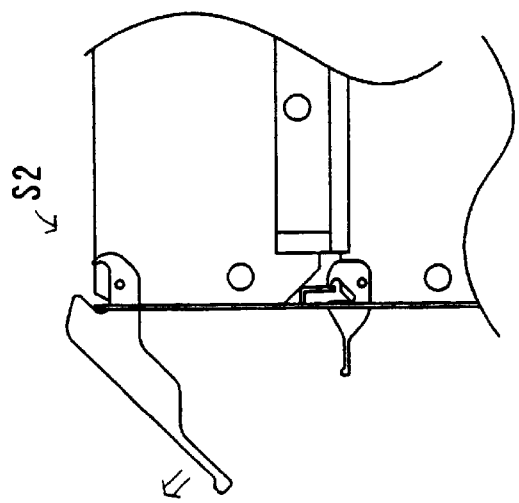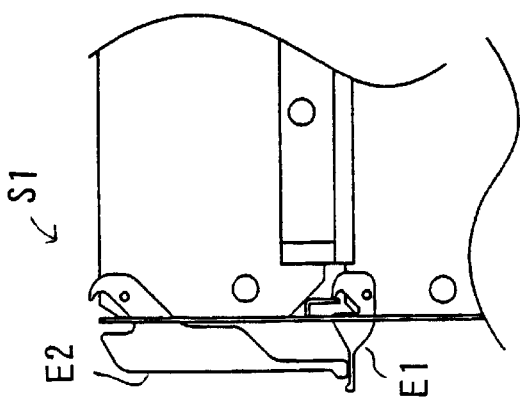
FIG. 8

ARRANGEMENT OF PINS ON MAIN CONNECTOR C2b

| NO. | COLUMN A | COLUMN B | | COLUMN C | COLUMN D | COLUMN E | | NO. |
|---|---|---|---|---|---|---|---|---|
| 1  | SG | SG    | SG    | SG | SG    | SG    | SG | 1  |
| 2  | SG | RD1P  | RD1N  | SG | SD1P  | SD1N  | SG | 2  |
| 3  | SG | SG    | SG    | SG | SG    | SG    | SG | 3  |
| 4  | SG | RD2P  | RD2N  | SG | SD2P  | SD2N  | SG | 4  |
| 5  | SG | SG    | SG    | SG | SG    | SG    | SG | 5  |
| 6  | SG | RD3P  | RD3N  | SG | SD3P  | SD3N  | SG | 6  |
| 7  | SG | SG    | SG    | SG | SG    | SG    | SG | 7  |
| 8  | SG | RD4P  | RD4N  | SG | SD4P  | SD4N  | SG | 8  |
| 9  | SG | SG    | SG    | SG | SG    | SG    | SG | 9  |
| 10 | SG | RCKP  | RCKN  | SG | SCKP  | SCKN  | SG | 10 |
| 11 | SG | SG    | SG    | SG | SG    | SG    | SG | 11 |
| 12 | SG | XACT  | SD    | SG | TCKP  | TCKN  | SG | 12 |
| 13 | SG | SG    | TD    | SG | SG    | SG    | SG | 13 |
| 14 | SG | PWR   | PWR   | SG | PWR   | PWR   | SG | 14 |
| 15 | SG | EMPTY | EMPTY | SG | EMPTY | EMPTY | SG | 15 |
| 16 | SG | EMPTY | EMPTY | SG | EMPTY | EMPTY | SG | 16 |
| 17 | SG | PWR   | PWR   | SG | PWR   | PWR   | SG | 17 |
| 18 | SG | SG    | SG    | SG | RTD   | SG    | SG | 18 |
| 19 | SG | RTCKN | RTCKP | SG | RSD   | RXACT | SG | 19 |
| 20 | SG | SG    | SG    | SG | SG    | SG    | SG | 20 |
| 21 | SG | RSCKN | RSCKP | SG | RRCKN | RRCKP | SG | 21 |
| 22 | SG | SG    | SG    | SG | SG    | SG    | SG | 22 |
| 23 | SG | RSD4N | RSD4P | SG | RRD4N | RRD4P | SG | 23 |
| 24 | SG | SG    | SG    | SG | SG    | SG    | SG | 24 |
| 25 | SG | RSD3N | RSD3P | SG | RRD3N | RRD3P | SG | 25 |
| 26 | SG | SG    | SG    | SG | SG    | SG    | SG | 26 |
| 27 | SG | RSD2N | RSD2P | SG | RRD2N | RRD2P | SG | 27 |
| 28 | SG | SG    | SG    | SG | SG    | SG    | SG | 28 |
| 29 | SG | RSD1N | RSD1P | SG | RRD1N | RRD1P | SG | 29 |
| 30 | SG | SG    | SG    | SG | SG    | SG    | SG | 30 |

FIG.14

ARRANGEMENT OF PINS ON SUBCONNECTOR C2a

| REVERSE INSERTION | NO. | COLUMN A | COLUMN B | COLUMN C | COLUMN D | COLUMN E | | NO. | REVERSE INSERTION |
|---|---|---|---|---|---|---|---|---|---|
| (30) | 1  | SG | SG    | SG    | SG | SG    | SG    | SG | 1  | (30) |
| (29) | 2  | SG | RD1P  | RD1N  | SG | SD1P  | SD1N  | SG | 2  | (29) |
| (28) | 3  | SG | SG    | SG    | SG | SG    | SG    | SG | 3  | (28) |
| (27) | 4  | SG | RD2P  | RD2N  | SG | SD2P  | SD2N  | SG | 4  | (27) |
| (26) | 5  | SG | SG    | SG    | SG | SG    | SG    | SG | 5  | (26) |
| (25) | 6  | SG | RD3P  | RD3N  | SG | SD3P  | SD3N  | SG | 6  | (25) |
| (24) | 7  | SG | SG    | SG    | SG | SG    | SG    | SG | 7  | (24) |
| (23) | 8  | SG | RD4P  | RD4N  | SG | SD4P  | SD4N  | SG | 8  | (23) |
| (22) | 9  | SG | SG    | SG    | SG | SG    | SG    | SG | 9  | (22) |
| (21) | 10 | SG | RCKP  | RCKN  | SG | SCKP  | SCKN  | SG | 10 | (21) |
| (20) | 11 | SG | SG    | SG    | SG | SG    | SG    | SG | 11 | (20) |
| (19) | 12 | SG | XACT  | SD    | SG | TCKP  | TCKN  | SG | 12 | (19) |
| (18) | 13 | SG | SG    | TD    | SG | SG    | SG    | SG | 13 | (18) |
| (17) | 14 | SG | PWR   | PWR   | SG | PWR   | PWR   | SG | 14 | (17) |
| (16) | 15 | SG | EMPTY | EMPTY | SG | EMPTY | EMPTY | SG | 15 | (16) |
| (15) | 16 | SG | EMPTY | EMPTY | SG | EMPTY | EMPTY | SG | 16 | (15) |
| (14) | 17 | SG | PWR   | PWR   | SG | PWR   | PWR   | SG | 17 | (14) |
| (13) | 18 | SG | SG    | SG    | SG | EMPTY | SG    | SG | 18 | (13) |
| (12) | 19 | SG | EMPTY | EMPTY | SG | EMPTY | EMPTY | SG | 19 | (12) |
| (11) | 20 | SG | SG    | SG    | SG | SG    | SG    | SG | 20 | (11) |
| (10) | 21 | SG | EMPTY | EMPTY | SG | EMPTY | EMPTY | SG | 21 | (10) |
| (9)  | 22 | SG | SG    | SG    | SG | SG    | SG    | SG | 22 | (9)  |
| (8)  | 23 | SG | EMPTY | EMPTY | SG | EMPTY | EMPTY | SG | 23 | (8)  |
| (7)  | 24 | SG | SG    | SG    | SG | SG    | SG    | SG | 24 | (7)  |
| (6)  | 25 | SG | EMPTY | EMPTY | SG | EMPTY | EMPTY | SG | 25 | (6)  |
| (5)  | 26 | SG | SG    | SG    | SG | SG    | SG    | SG | 26 | (5)  |
| (4)  | 27 | SG | EMPTY | EMPTY | SG | EMPTY | EMPTY | SG | 27 | (4)  |
| (3)  | 28 | SG | SG    | SG    | SG | SG    | SG    | SG | 28 | (3)  |
| (2)  | 29 | SG | EMPTY | EMPTY | SG | EMPTY | EMPTY | SG | 29 | (2)  |
| (1)  | 30 | SG | SG    | SG    | SG | SG    | SG    | SG | 30 | (1)  |

REVERSE INSERTION (COUMN E) (COLUMN D) (COLUMN C) (COLUMN B) (COLUMN A)

FIG.15

ARRANGEMENT OF PINS ON MAIN CONNECTOR C2b

| NO. | COLUMN A | COLUMN B | | COLUMN C | COLUMN D | COLUMN E | | NO. |
|---|---|---|---|---|---|---|---|---|
| 1 | SG | SG | SG | SG | SG | SG | SG | 1 |
| 2 | SG | RD1P | RD1N | SG | SD1P | SD1N | SG | 2 |
| 3 | SG | SG | SG | SG | SG | SG | SG | 3 |
| 4 | SG | RD2P | RD2N | SG | SD2P | SD2N | SG | 4 |
| 5 | SG | SG | SG | SG | SG | SG | SG | 5 |
| 6 | SG | RD3P | RD3N | SG | SD3P | SD3N | SG | 6 |
| 7 | SG | SG | SG | SG | SG | SG | SG | 7 |
| 8 | SG | RD4P | RD4N | SG | SD4P | SD4N | SG | 8 |
| 9 | SG | SG | SG | SG | SG | SG | SG | 9 |
| 10 | SG | RCKP | RCKN | SG | SCKP | SCKN | SG | 10 |
| 11 | SG | SG | SG | SG | SG | SG | SG | 11 |
| 12 | SG | XACT | SD | SG | TCKP | TCKN | SG | 12 |
| 13 | SG | SG | TD | SG | SG | SG | SG | 13 |
| 14 | SG | PWR | PWR | SG | PWR | PWR | SG | 14 |
| 15 | SG | EMPTY | EMPTY | SG | EMPTY | EMPTY | SG | 15 |
| 16 | SG | EMPTY | EMPTY | SG | EMPTY | EMPTY | SG | 16 |
| 17 | SG | PWR | PWR | SG | PWR | PWR | SG | 17 |
| 18 | SG | SG | SG | SG | RTD | SG | SG | 18 |
| 19 | SG | RTCKN | RTCKP | SG | RSD | RXACT | SG | 19 |
| 20 | SG | SG | SG | SG | SG | SG | SG | 20 |
| 21 | SG | RSCKN | RSCKP | SG | RRCKN | RRCKP | SG | 21 |
| 22 | SG | SG | SG | SG | SG | SG | SG | 22 |
| 23 | SG | RSD4N | RSD4P | SG | RRD4N | RRD4P | SG | 23 |
| 24 | SG | SG | SG | SG | SG | SG | SG | 24 |
| 25 | SG | RSD3N | RSD3P | SG | RRD3N | RRD3P | SG | 25 |
| 26 | SG | SG | SG | SG | SG | SG | SG | 26 |
| 27 | SG | RSD2N | RSD2P | SG | RRD2N | RRD2P | SG | 27 |
| 28 | SG | SG | SG | SG | SG | SG | SG | 28 |
| 29 | SG | RSD1N | RSD1P | SG | RRD1N | RRD1P | SG | 29 |
| 30 | SG | SG | SG | SG | SG | SG | SG | 30 |

FIG.18

ARRANGEMENT OF PINS ON SUBCONNECTOR C2a

| REVERSE INSERTION | NO. | COLUMN A | COLUMN B | COLUMN C | COLUMN D | COLUMN E | | NO. | REVERSE INSERTION |
|---|---|---|---|---|---|---|---|---|---|
| (30) | 1 | SG | SG | SG | SG | SG | SG | 1 | (30) |
| (29) | 2 | SG | RD1P | RD1N | SG | SD1P | SD1N | SG | 2 | (29) |
| (28) | 3 | SG | SG | SG | SG | SG | SG | SG | 3 | (28) |
| (27) | 4 | SG | RD2P | RD2N | SG | SD2P | SD2N | SG | 4 | (27) |
| (26) | 5 | SG | SG | SG | SG | SG | SG | SG | 5 | (26) |
| (25) | 6 | SG | RD3P | RD3N | SG | SD3P | SD3N | SG | 6 | (25) |
| (24) | 7 | SG | SG | SG | SG | SG | SG | SG | 7 | (24) |
| (23) | 8 | SG | RD4P | RD4N | SG | SD4P | SD4N | SG | 8 | (23) |
| (22) | 9 | SG | SG | SG | SG | SG | SG | SG | 9 | (22) |
| (21) | 10 | SG | RCKP | RCKN | SG | SCKP | SCKN | SG | 10 | (21) |
| (20) | 11 | SG | SG | SG | SG | SG | SG | SG | 11 | (20) |
| (19) | 12 | SG | XACT | SD | SG | TCKP | TCKN | SG | 12 | (19) |
| (18) | 13 | SG | SG | TD | SG | SG | SG | SG | 13 | (18) |
| (17) | 14 | SG | PWR | PWR | SG | PWR | PWR | SG | 14 | (17) |
| (16) | 15 | SG | EMPTY | EMPTY | SG | EMPTY | EMPTY | SG | 15 | (16) |
| (15) | 16 | SG | EMPTY | EMPTY | SG | EMPTY | EMPTY | SG | 16 | (15) |
| (14) | 17 | SG | PWR | PWR | SG | PWR | PWR | SG | 17 | (14) |
| (13) | 18 | SG | SG | SG | SG | EMPTY | SG | SG | 18 | (13) |
| (12) | 19 | SG | EMPTY | EMPTY | SG | EMPTY | EMPTY | SG | 19 | (12) |
| (11) | 20 | SG | SG | SG | SG | SG | SG | SG | 20 | (11) |
| (10) | 21 | SG | RBCN | RBCP | SG | RBCN | RBCP | SG | 21 | (10) |
| (9) | 22 | SG | SG | SG | SG | SG | SG | SG | 22 | (9) |
| (8) | 23 | SG | RB4N | RB4P | SG | RB4N | RB4P | SG | 23 | (8) |
| (7) | 24 | SG | SG | SG | SG | SG | SG | SG | 24 | (7) |
| (6) | 25 | SG | RB3N | RB3P | SG | RB3N | RB3P | SG | 25 | (6) |
| (5) | 26 | SG | SG | SG | SG | SG | SG | SG | 26 | (5) |
| (4) | 27 | SG | RB2N | RB2P | SG | RB2N | RB2P | SG | 27 | (4) |
| (3) | 28 | SG | SG | SG | SG | SG | SG | SG | 28 | (3) |
| (2) | 29 | SG | RB1N | RB1P | SG | RB1N | RB1P | SG | 29 | (2) |
| (1) | 30 | SG | SG | SG | SG | SG | SG | SG | 30 | (1) |
| REVERSE INSERTION | | (COLUMN E) | (COLUMN D) | (COLUMN C) | (COLUMN B) | (COLUMN A) | | | |

FIG.19

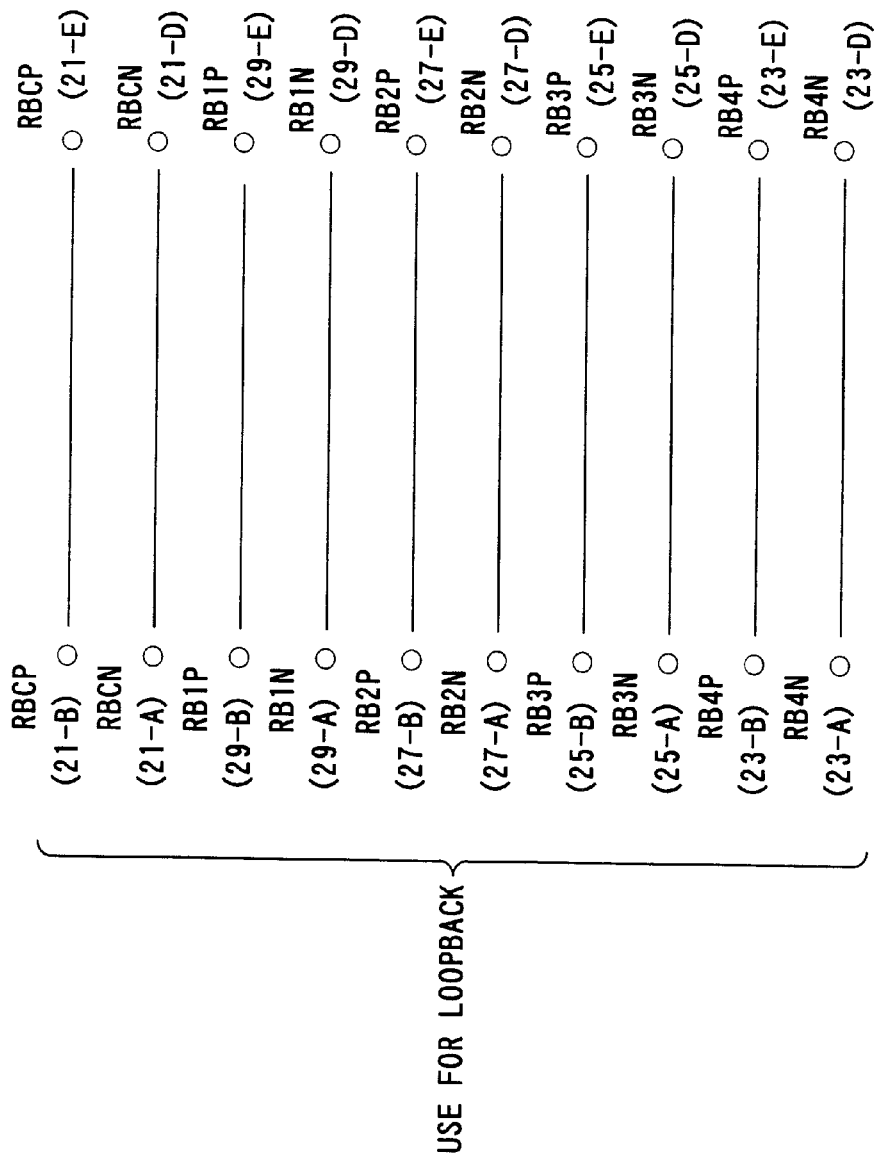

ARRANGEMENT OF PINS ON MAIN CONNECTOR C2b

| NO. | | COLUMN A | COLUMN B | COLUMN C | COLUMN D | COLUMN E | | NO. |
|---|---|---|---|---|---|---|---|---|
| 1 | SG | SG | SG | SG | SG | SG | SG | 1 |
| 2 | SG | PWR | PWR | SG | PWR | PWR | SG | 2 |
| 3 | SG | SG | SG | SG | SG | SG | SG | 3 |
| 4 | SG | SD1P | SD1N | SG | SD2P | SD2N | SG | 4 |
| 5 | SG | SG | SG | SG | SG | SG | SG | 5 |
| 6 | SG | SD3P | SD3N | SG | SD4P | SD4N | SG | 6 |
| 7 | SG | SG | SG | SG | SG | SG | SG | 7 |
| 8 | SG | SCKP | SCKN | SG | TD | XACT | SG | 8 |
| 9 | SG | SG | SG | SG | SG | SG | SG | 9 |
| 10 | SG | RCKP | RCKN | SG | SD | SG | SG | 10 |
| 11 | SG | SG | SG | SG | SG | SG | SG | 11 |
| 12 | SG | RD1P | RD1N | SG | RD2N | RD2P | SG | 12 |
| 13 | SG | SG | SG | SG | SG | SG | SG | 13 |
| 14 | SG | RD3P | RD3N | SG | RD4N | RD4P | SG | 14 |
| 15 | SG | SG | SG | SG | SG | SG | SG | 15 |
| 16 | SG | SG | RSD | SG | RRCKN | RRCKP | SG | 16 |
| 17 | SG | SG | SG | SG | SG | SG | SG | 17 |
| 18 | SG | RXACT | RTD | SG | RSCKN | RSCKP | SG | 18 |
| 19 | SG | SG | SG | SG | SG | SG | SG | 19 |
| 20 | SG | RSD4N | RSD4P | SG | RSD3N | RSD3P | SG | 20 |
| 21 | SG | SG | SG | SG | SG | SG | SG | 21 |
| 22 | SG | RSD2N | RSD2P | SG | RSD1N | RSD1P | SG | 22 |
| 23 | SG | SG | SG | SG | SG | SG | SG | 23 |
| 24 | SG | PWR | PWR | SG | PWR | PWR | SG | 24 |
| 25 | SG | SG | SG | SG | SG | SG | SG | 25 |
| 26 | | | | | | | | 26 |
| 27 | | | | | | | | 27 |
| 28 | | | AREA WHERE THE NUMBER OF PINS IS REDUCED | | | | | 28 |
| 29 | | | | | | | | 29 |
| 30 | | | | | | | | 30 |

FIG.25

ARRANGEMENT OF PINS ON SUBCONNECTOR C2a

| REVERSE INSERTION | NO. | | COLUMN A | COLUMN B | COLUMN C | COLUMN D | COLUMN E | | NO. | REVERSE INSERTION |
|---|---|---|---|---|---|---|---|---|---|---|
| (30) | 1 | SG | SG | SG | SG | SG | SG | SG | 1 | (30) |
| (29) | 2 | SG | PWR | PWR | SG | PWR | PWR | SG | 2 | (29) |
| (28) | 3 | SG | SG | SG | SG | SG | SG | SG | 3 | (28) |
| (27) | 4 | SG | SD1P | SD1N | SG | SD2P | SD2N | SG | 4 | (27) |
| (26) | 5 | SG | SG | SG | SG | SG | SG | SG | 5 | (26) |
| (25) | 6 | SG | SD3P | SD3N | SG | SD4P | SD4N | SG | 6 | (25) |
| (24) | 7 | SG | SG | SG | SG | SG | SG | SG | 7 | (24) |
| (23) | 8 | SG | SCKP | SCKN | SG | TD | XACT | SG | 8 | (23) |
| (22) | 9 | SG | SG | SG | SG | SG | SG | SG | 9 | (22) |
| (21) | 10 | SG | RCKP | RCKN | SG | SD | SG | SG | 10 | (21) |
| (20) | 11 | SG | SG | SG | SG | SG | SG | SG | 11 | (20) |
| (19) | 12 | SG | RD1P | RD1N | SG | RD2N | RD2P | SG | 12 | (19) |
| (18) | 13 | SG | SG | SG | SG | SG | SG | SG | 13 | (18) |
| (17) | 14 | SG | RD3P | RD3N | SG | RD4N | RD4P | SG | 14 | (17) |
| (16) | 15 | SG | SG | SG | SG | SG | SG | SG | 15 | (16) |
| (15) | 16 | SG | EMPTY | EMPTY | SG | EMPTY | EMPTY | SG | 16 | (15) |
| (14) | 17 | SG | SG | SG | SG | SG | SG | SG | 17 | (14) |
| (13) | 18 | SG | EMPTY | EMPTY | SG | EMPTY | EMPTY | SG | 18 | (13) |
| (12) | 19 | SG | SG | SG | SG | SG | SG | SG | 19 | (12) |
| (11) | 20 | SG | EMPTY | EMPTY | SG | EMPTY | EMPTY | SG | 20 | (11) |
| (10) | 21 | SG | SG | SG | SG | SG | SG | SG | 21 | (10) |
| (9) | 22 | SG | EMPTY | EMPTY | SG | EMPTY | EMPTY | SG | 22 | (9) |
| (8) | 23 | SG | SG | SG | SG | SG | SG | SG | 23 | (8) |
| (7) | 24 | SG | EMPTY | EMPTY | SG | EMPTY | EMPTY | SG | 24 | (7) |
| (6) | 25 | SG | SG | SG | SG | SG | SG | SG | 25 | (6) |
| (5) | 26 | | | | | | | | 26 | (5) |
| (4) | 27 | | | | | | | | 27 | (4) |
| (3) | 28 | | AREA WHERE THE NUMBER OF PINS IS REDUCED | | | | | | 28 | (3) |
| (2) | 29 | | | | | | | | 29 | (2) |
| (1) | 30 | | | | | | | | 30 | (1) |
| REVERSE INSERTION | | | (COUMN E) | (COLUMN D) | (COLUMN C) | (COLUMN B) | (COLUMN A) | | | |

* EXTEND THROUGH SPACE OUTSIDE LARGE PIU (B)

*TWO TYPES OF PIUS WILL BE MANUFACTURED. WITH A PIU OF ONE TYPE, AN OPTICAL FIBER CABLE IS INTRODUCED FROM THE UPPER PORTION OF THE FRONT. WITH A PIU IF THE OTHER TYPE, AN OPTICAL FIBER CABLE IS INTRODUED FROM THE LOWER PORTION OF THE FRONT.

TRANSMISSION APPARATUS

BACKGROUND OF THE INVENTION (1) Field of the Invention

This invention relates to a transmission apparatus and, more particularly, to a transmission apparatus for controlling the transmission of signals by introducing cables.

(2) Description of the Related Art

Optical communication network technologies are nuclei for building data communication network infrastructure. In recent years it is hoped that more advanced services will be provided in a wider area. Such technologies therefore are being developed at arapidpace toward an information-oriented society.

In addition, key networks with larger capacity have recently been needed because of, for example, an increase in demand for transmission with the spread of the Internet. This leads to a need for a higher device density, larger information transmission capacity, more advanced functions, and the like.

As a result, there is an increase in the number of optical fiber cables introduced. Therefore, problems about, for example, how to introduce optical fiber cables, cable bunchability, the layout of the enclosure (subrack) of a plug-in unit (PIU), being a unit connected to an optical fiber cable with a connector for controlling an interface for sending and receiving optical signals, have been taken up.

FIG. 27 is a schematic view of a conventional optical transmission apparatus which introduces optical fiber cables from the lower portion of the front. A plurality of PIUs are mounted in a subrack 300 of an optical transmission apparatus 500a. Small PIUs 400a are mounted in the left half of the subrack 300, being a double-decker, and large PIUs 400b are mounted in the right half of the subrack 300 (hereinafter both of the PIU 400a and PIU 400b are referred to as PIUs 400).

When a PIU 400 is mounted in the subrack 300, an optical fiber cable connected to a connector inside the PIU 400 is pulled out from a notch made in the lower portion of a surface plate 41. Then optical fiber cables are bunched along ducts d1 and d2 on the subrack 300.

FIG. 28 is a schematic view of the PIU 400. A notch is made in the lower portion of the surface plate 41 of a PIU 400-1 so that an optical fiber cable can be introduced easily from the front of the subrack 300. A connector 42 is located on the front of the PIU 400-1 and is mounted downward so that an optical fiber cable can be connected to it easily.

FIG. 29 is a schematic view of a conventional optical transmission apparatus which introduces optical fiber cables from the upper portion of the front. In an optical transmission apparatus 500b, optical fiber cables pulled out from the PIUs 400 are bunched along a duct d3 located at the top of the front of the subrack 300.

FIG. 30 is a schematic view of the PIU 400. A notch is made in the upper portion of the surface plate 41 of a PIU 400-2. The connector 42 is located on the front of the PIU 400-2 and is mounted upward.

With the conventional optical transmission apparatuses 500a and 500b described above, optical fiber cables are introduced into the PIUs 400 from the lower or upper portion of the front of the subrack 300. With such apparatuses, a user must be able to insert or pull out the PIUs 400 easily by introducing optical fiber cables for himself/herself.

However, placing first priority on an optical fiber cable being introduced smoothly will lead to a layout (arrangement of PIUs) in which an optical fiber cable can be introduced easily into the PIU 400. A flexible structural design therefore cannot be made. Furthermore, the layout of PIUs will be limited by the direction from which an optical fiber cable is introduced. This will lead to complex wirings on a back wiring board (BWB) at the rear of the subrack 300.

Meanwhile, it is assumed that a multiplexing-separating unit for controlling multiplexing and separating, that is to say, for concentrating and multiplexing signals from units or for separating a multiplexed signal and distributing separated signals to each unit is mounted in a subrack.

In this case, if a multiplexing-separating unit is mounted at the end of a subrack, wirings on a BWB which connect the multiplexing-separating unit and signal processing units for processing signals individually will differ significantly in length. Especially with a system for processing high-frequency signals, a problem about such an arrangement is important.

In order to minimize the difference in wiring length, a multiplexing-separating unit must be located in the middle of the subrack. However, some conventional structures have made it impossible to make such a design.

FIGS. 31(A) and 31(B) are views showing problems with the prior arts. FIG. 31(A) shows a case where optical fiber cables are introduced from the lower portion of the front of a subrack and FIG. 31(B) shows a case where optical fiber cables are introduced from the upper and lower portions of the front of a subrack.

In FIGS. 31(A) and 31(B), it is assumed that an optical transmission apparatus has the following structure. The middle portion of the subrack is a double-decker and the small PIUs 400a (multiplexing-separating control unit) can be inserted into the upper and lower tiers. The large PIUs 400b (signal processing unit) are mounted in the left and right portions of the subrack.

In the case of FIG. 31(A), if the small PIUs 400a (an optical fiber cable is pulled out from the lower portion of the surface plate of each PIU) are mounted in the middle portion of the subrack, optical fiber cables pulled out from the PIUs 400a mounted in the upper tier of the middle portion of the subrack will extend through a space outside the large PIU 400b mounted in the left portion. This will make it impossible to insert or pull out the large PIU 400b freely.

In the case of FIG. 31(B), ducts are located at the top and bottom of the front of the subrack in which PIUs 400a-2, a PIU 400b-2, PIUs 400a-1, and a PIU 400b-1 are mounted. An optical fiber cable is pulled out from the upper portion of the surface plate of each of the PIUs 400a-2 and PIU 400b-2. On the other hand, an optical fiber cable is pulled out from the lower portion of the surface plate of each of the PIUs 400a-1 and PIU 400b-1. In this case, the problem which arises in FIG. 31(A) can be solved, but two types of PIUs (a PIU of one type introduces an optical fiber cable from the upper portion of its front and a PIU of the other type introduces an optical fiber cable from the lower portion of its front) with the same functions must be designed. A user must also keep these two types of PIUs with the same functions in stock. This will lead to extremely low efficiency in design, maintenance, and purchase.

SUMMARY OF THE INVENTION

In order to address such problems, the present invention was made. In other words, an object of the present invention is to provide a transmission apparatus having a flexible external cable introduction structure for controlling the transmission of signals efficiently.

In order to achieve the above object, a transmission apparatus for controlling signal transmission by introducing cables is provided. This transmission apparatus comprises transmission units each including a sub-printed circuit board on which a cable connector for introducing the cable from the outside is fixed and a main printed circuit board with a guide rail along which the sub-printed circuit board can be inserted reversely to change the direction from which the cable is introduced at the time of the sub-printed circuit board being housed and an enclosure with ducts for bunching the cables in which the transmission units are mounted.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIGS. 3(A) and 3(B) are views showing the structure of a PIU unit. FIG. 3(A) is a view showing a state in which a sub-printed circuit board is inserted normally and FIG. 3(B) is a view showing a state in which a sub-printed circuit board is inserted reversely.

FIGS. 4(A) and 4(B) are views showing the structure of guide rails. FIG. 4(A) is a view showing the normal insertion state and FIG. 4(B) is a view showing the reverse insertion state.

FIG. 5(A) shows the structure of a guide rail for preventing misinsertion in the case of the normal insertion and FIG. 5(B) is a cross-sectional view taken along the line Y—Y of FIG. 5(A).

FIG. 6(A) shows the structure of a guide rail for preventing misinsertion in the case of the reverse insertion and FIG. 6(B) is a cross-sectional view taken along the line Y—Y of FIG. 6(A).

FIG. 8 is a view showing the operation of the ejector.

FIG. 14 is a view showing the arrangement of pins on a connector.

FIG. 15 is a view showing the arrangement of pins on a connector.

FIG. 16(A) is a view showing the arrangement of pins on a main connector (main pin arrangement) and FIG. 16(B) is a view showing the arrangement of pins on a subconnector (sub-pin arrangements).

FIG. 18 is a view showing the arrangement of pins on a connector with a loopback taken into consideration.

FIG. 19 is a view showing the arrangement of pins on a connector with loopback taken into consideration.

FIG. 20 is a view showing connection for a loopback on a sub-printed circuit board.

FIG. 25 is a view showing the arrangement of pins on a connector.

FIG. 26 is a view showing the arrangement of pins on a connector.

FIG. 31(A) shows a case where optical fiber cables are introduced from the lower portion of the front of a subrack and FIG. 31(B) shows a case where optical fiber cables are introduced from the upper and lower portions of the front of a subrack.

DESCRIPTION OF THE PREFERRED EMBODIMENTS

Figure 1:
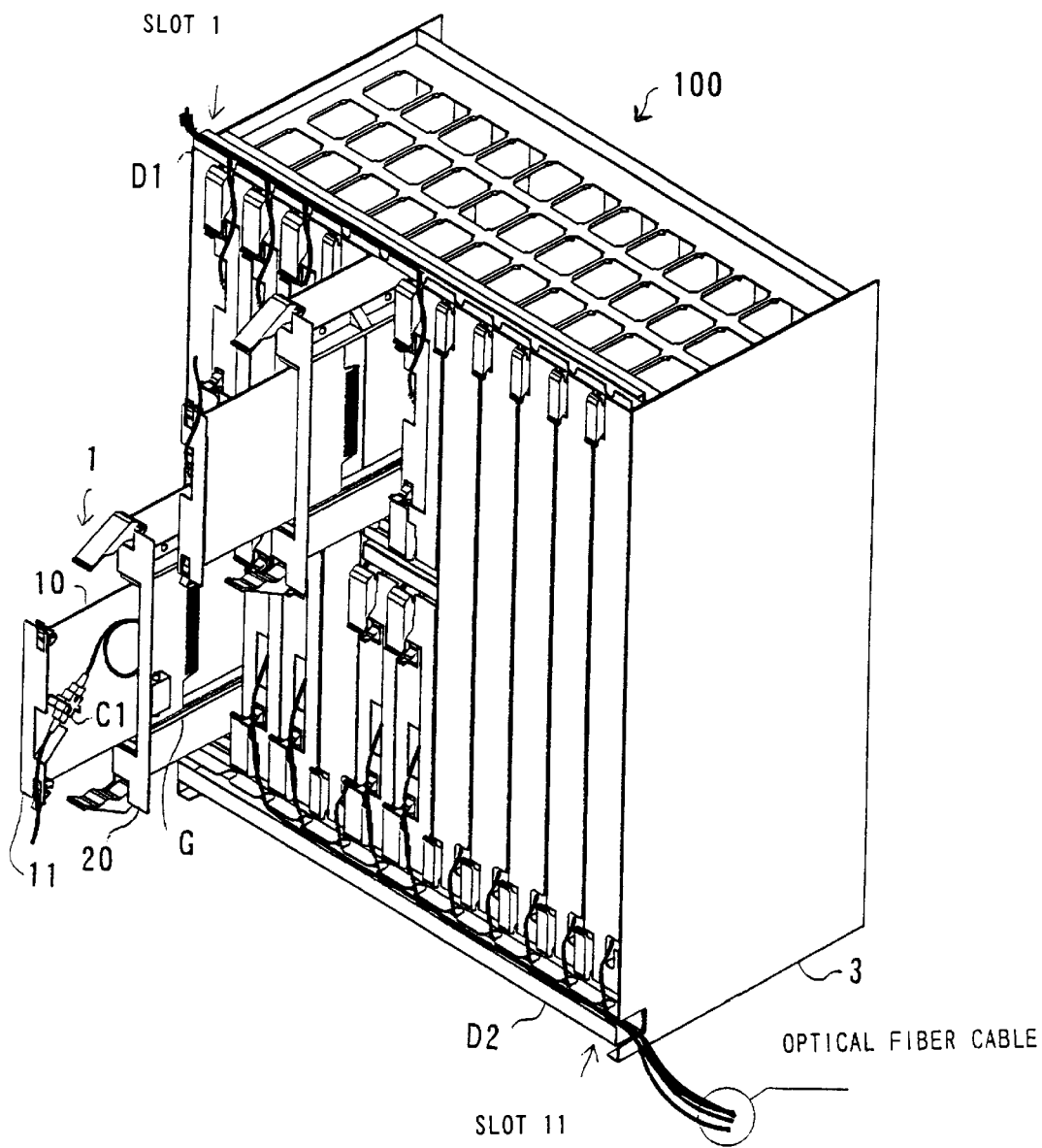
FIG. 1 is a view showing the structure of a transmission apparatus according to the present invention.

Embodiments of the present invention will now be described with reference to the drawings. FIG. 1 is a view showing the structure of a transmission apparatus according to the present invention. A transmission apparatus 100 controls the transmission of signals by introducing cables from the outside. Hereinafter these cables will be considered as optical fiber cables.

A plurality of transmission units (PIU units) 1 are mounted in an enclosure (subrack) 3 of the transmission apparatus 100. The present invention will now be described with a layout shown in FIG. 1 as an example.

The subrack 3 has eleven slots. Slots 1 through 3, 5, and 6 are double-deckers and the PIU units 1 according to the present invention are mounted in them. Furthermore, large PIUs are mounted in slots 4 and 7 through 11. Ducts D1 and D2 for bunching optical fiber cables pulled out from the PIU units 1 and large PIUs are formed at the top and bottom of the front of the subrack 3.

The PIU unit 1 is composed of a sub-printed circuit board 10 and a main printed circuit board 20. The sub-printed circuit board 10 is used to introduce an optical fiber cable from the outside, that is to say, to connect an optical fiber cable from the outside to a connector on it. The main printed circuit board 20 is used to house the sub-printed circuit board 10 and connects with a BWB mounted on the subrack 3.

A cable connector C1 which connects with an optical fiber cable is mounted on the sub-printed circuit board 10. Optical modules and other circuit elements (not shown) are also mounted on the sub-printed circuit board 10.

To connect an optical fiber cable to the cable connector C1, an extra length of more than several ten centimeters will be needed for work. Therefore, usually an optical fiber cable will be wound into several loops and be housed on the sub-printed circuit board 10. In this case, if the radius of the loops is too short, the optical fiber cable will be in a strained state for a long time. This can lead to a fatigue failure.

Therefore, when an optical fiber cable is connected to the cable connector C1 to introduce it from the outside, lateral pressure, torsional stress, and the like must be avoided and a cable area on the sub-printed circuit board 10 must be minimized.

If these are taken into consideration, an optical fiber cable will be introduced at an acute angle to a surface plate 11 of the sub-printed circuit board 10. As a result, the cable connector C1 is also located on the sub-printed circuit board 10 at an acute angle to the surface plate 11 in order to introduce an optical fiber cable smoothly.

The main printed circuit board 20 has guide rails G for housing the sub-printed circuit board 10 on its upper and lower portions. Circuit elements (not shown) are also mounted on the main printed circuit board 20. These guide rails G are used to house the sub-printed circuit board 10. The guide rails G enable the sub-printed circuit board 10 to be inserted with its component-mounted side turned to the right to the main printed circuit board 20 (normal insertion) or with its component-mounted side turned to the left to the main printed circuit board 20 (reverse insertion).

This enables to change the direction from which an optical fiber cable is introduced (the direction of the cable connector C1). Conventionally, two types of PIUs have been manufactured in order to pull out optical fiber cables from the upper and lower portions of the surface plate 11. However, this structure will make it unnecessary to do so. Even one type of sub-printed circuit boards 10 will make it possible to introduce optical fiber cables from the lower or upper portion of the front of the subrack 3.

Figure 2:
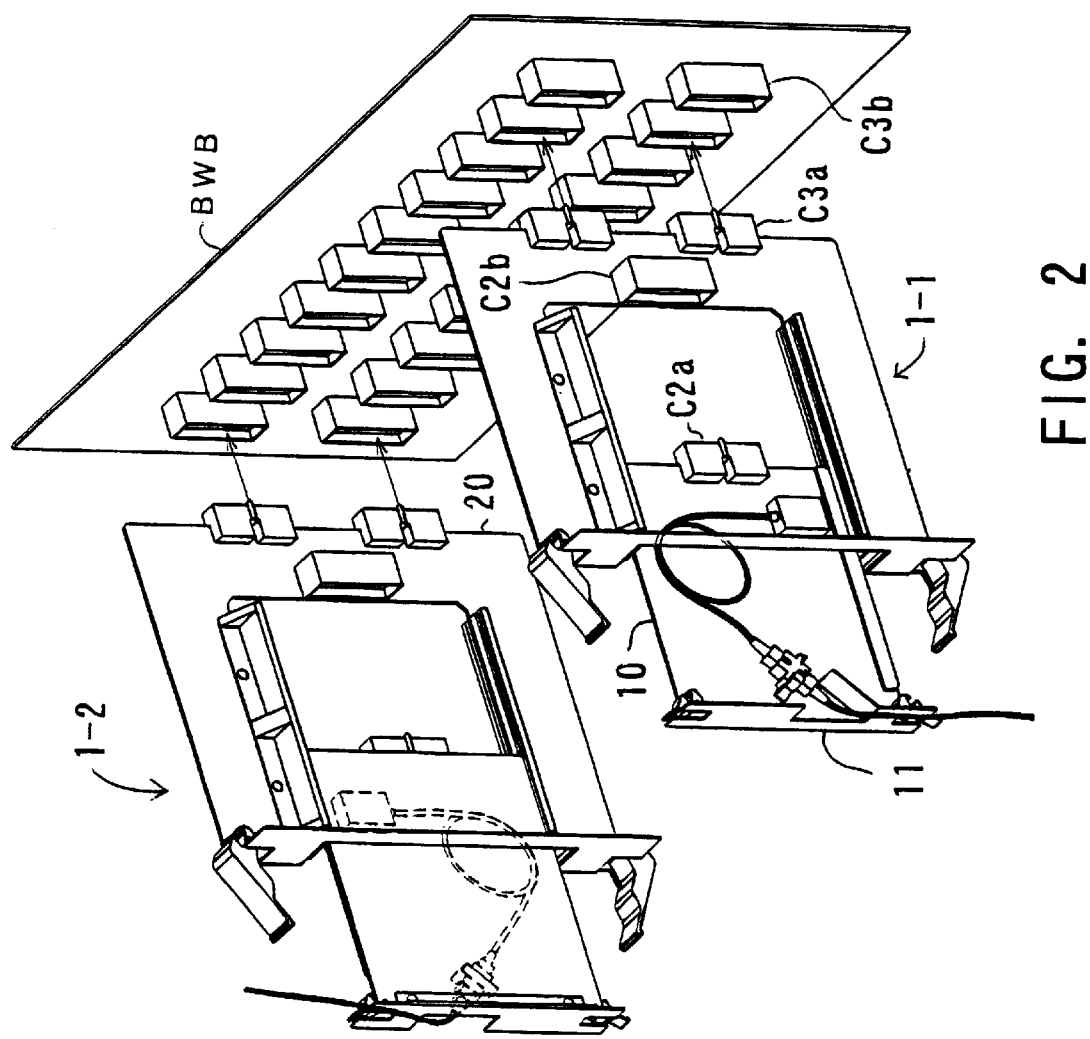
FIG. 2 is a view showing how to mount a PIU unit.

FIG. 2 is a view showing how to mount the PIU unit 1. A subconnector C2a and main connector C2b are mounted on the sub-printed circuit board 10 and main printed circuit board 20, respectively, for connecting the sub-printed circuit board 10 and main printed circuit board 20 with connectors (for fitting a connector on the sub-printed circuit board 10 into a connector on the main printed circuit board 20). Furthermore, back board connectors C3a and C3b are mounted on the main printed circuit board 20 and the BWB of the subrack 3, respectively, for connecting the main printed circuit board 20 and BWB with connectors.

In a PIU unit 1-1, the sub-printed circuit board 10 is inserted normally into the main printed circuit board 20 and is housed by it. An optical fiber cable is pulled out from the lower portion of the surface plate 11. In a PIU unit 1-2, the sub-printed circuit board 10 is inserted reversely into the main printed circuit board 20 and is housed by it. An optical fiber cable is pulled out from the upper portion of the surface plate 11. The PIU units 1-1 and 1-2 which house the sub-printed circuit boards 10 in this way are mounted in the subrack 3 and connect with the BWB.

FIGS. 3(A) and 3(B) are views showing the structure of the PIU unit 1. FIG. 3(A) is a view showing a state in which the sub-printed circuit board 10 is inserted normally and FIG. 3(B) is a view showing a state in which the sub-printed circuit board 10 is inserted reversely.

In the PIU unit 1, the back board connector C3a, the main connector C2b, the (upper and lower) guide rails G, and (upper and lower) main ejectors E2 for mounting and fixing the PIU unit 1 in the subrack 3 are located on a main printed circuit board 20.

The subconnector C2a, an extra length 13 of an optical fiber cable which connects with an end portion 12 of the optical fiber cable, the cable connector C1 (which is located at an acute angle to the surface plate 11, as shown in FIG. 3(A)), the surface plate 11 in which a notch is made to pull out the optical fiber cable, and (upper and lower) subejectors E1 for housing and fixing the sub-printed circuit board 10 in the main printed circuit board 20 are located on the sub-printed circuit board 10.

FIGS. 4(A) and 4(B) are views showing the structure of the guide rails G. FIG. 4(A) is a view showing the normal insertion state and FIG. 4(B) is a view showing the reverse insertion state. The guide rails G include a first guide rail (guide rail G1) for inserting the sub-printed circuit board 10 normally and a second guide rail (guide rail G2) for inserting the sub-printed circuit board 10 reversely.

The guide rail G1 is formed at position P1 (inside) on the main printed circuit board 20 shown in FIG. 4(A). The sub-printed circuit board 10 is inserted normally along the guide rail G1. The subconnector C2a are fitted into the main connector C2b and the sub-printed circuit board 10 is housed in the main printed circuit board 20. An optical fiber cable is pulled out in a downward direction.

The guide rail G2 is formed at position P2 (outside) on the main printed circuit board 20 shown in FIG. 4(B). The sub-printed circuit board 10 is inserted reversely along the guide rail G2. The subconnector C2a is fitted into the main connector C2b and the sub-printed circuit board 10 is housed in the main printed circuit board 20. An optical fiber cable is pulled out in an upward direction.

Figure 5A:
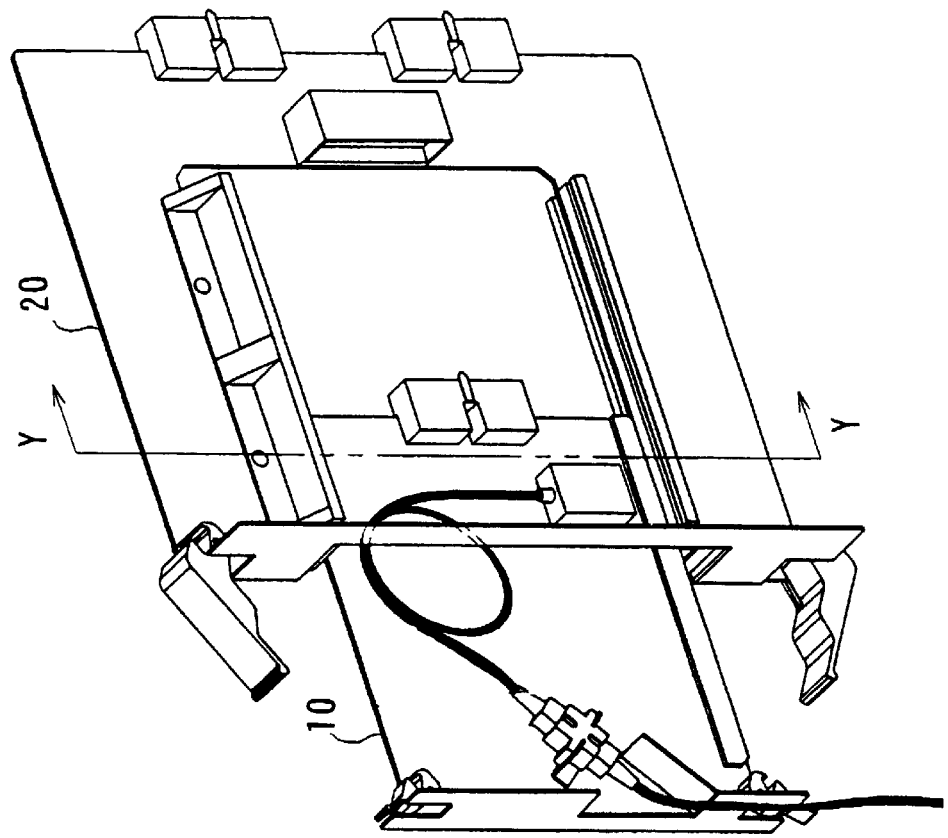
FIGS. 5(A) and 5(B) are views showing the structure of a guide rail for preventing misinsertion.
Figure 5B:
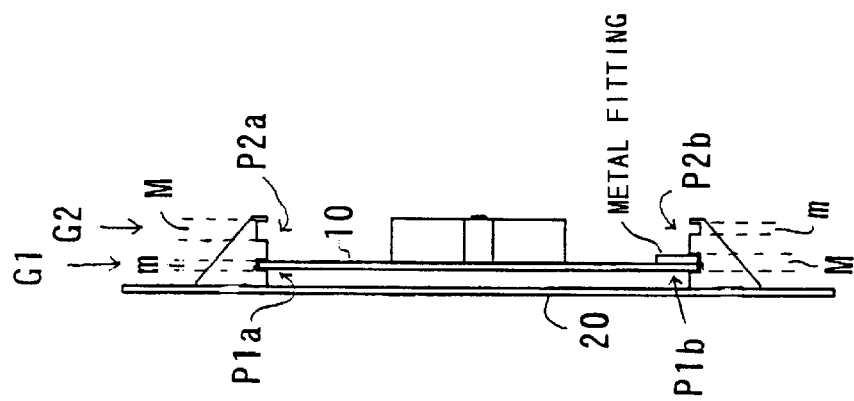
Figure 6A:
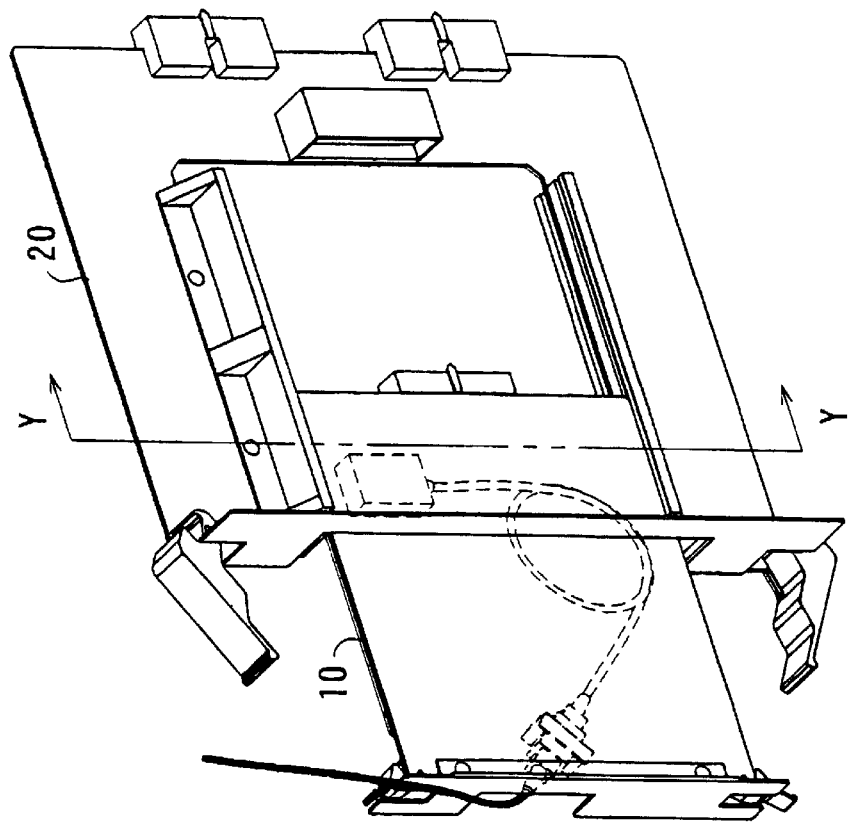
FIGS. 6(A) and 6(B) are views showing the structure of a guide rail for preventing misinsertion.
Figure 6B:
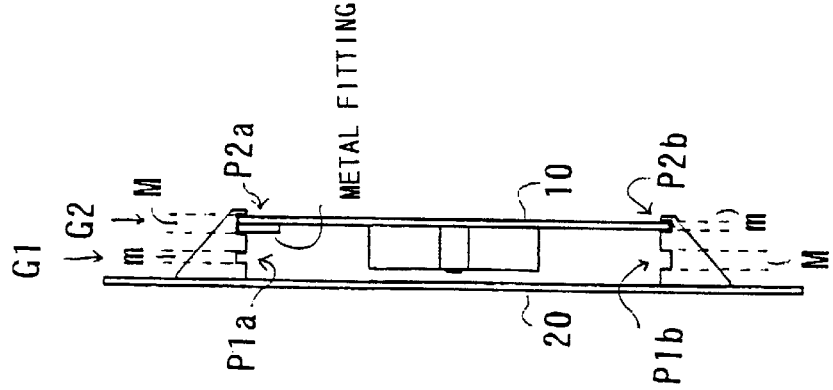

FIGS. 5(A), 5(B), 6(A), and 6(B) are views showing the structure of a guide rail for preventing misinsertion. FIG. 5(A) shows the structure of a guide rail for preventing misinsertion in the case of the normal insertion and FIG. 5(B) is a cross-sectional view taken along the line Y—Y of FIG. 5(A). FIG. 6(A) shows the structure of a guide rail for preventing misinsertion in the case of the reverse insertion and FIG. 6(B) is a cross-sectional view taken along the line Y—Y of FIG. 6(A).

With the guide rail G1, a rail having a groove width of m is located at position P1a and a rail having a groove width of M (M>m) is located at position P1b. With the guide rail G2, a rail having a groove width of M is located at position P2a and a rail having a groove width of m is located at position P2b.

One of the two sides of the sub-printed circuit board 10 along the guide rails G1 and G2 has a thickness (the original thickness of the sub-printed circuit board 10) which fits into the rails having a groove width of m. The thickness of the other side is increased (by attaching a member, such as a metal fitting, on it) so that it will fit into the rails having a groove width of M.

Therefore, inserting the sub-printed circuit board 10 along the guide rail G1 will enable only the normal insertion and inserting the sub-printed circuit board 10 along the guide rail G2 will enable only the reverse insertion.

As described above, the misinsertion of the sub-printed circuit board 10 into the main printed circuit board 20 can be prevented by forming rails having different groove widths in the guide rails G1 and G2 and by suiting the thicknesses of the sides of the sub-printed circuit board 10 along the guide rails G1 and G2 to these groove widths.

Figure 7:
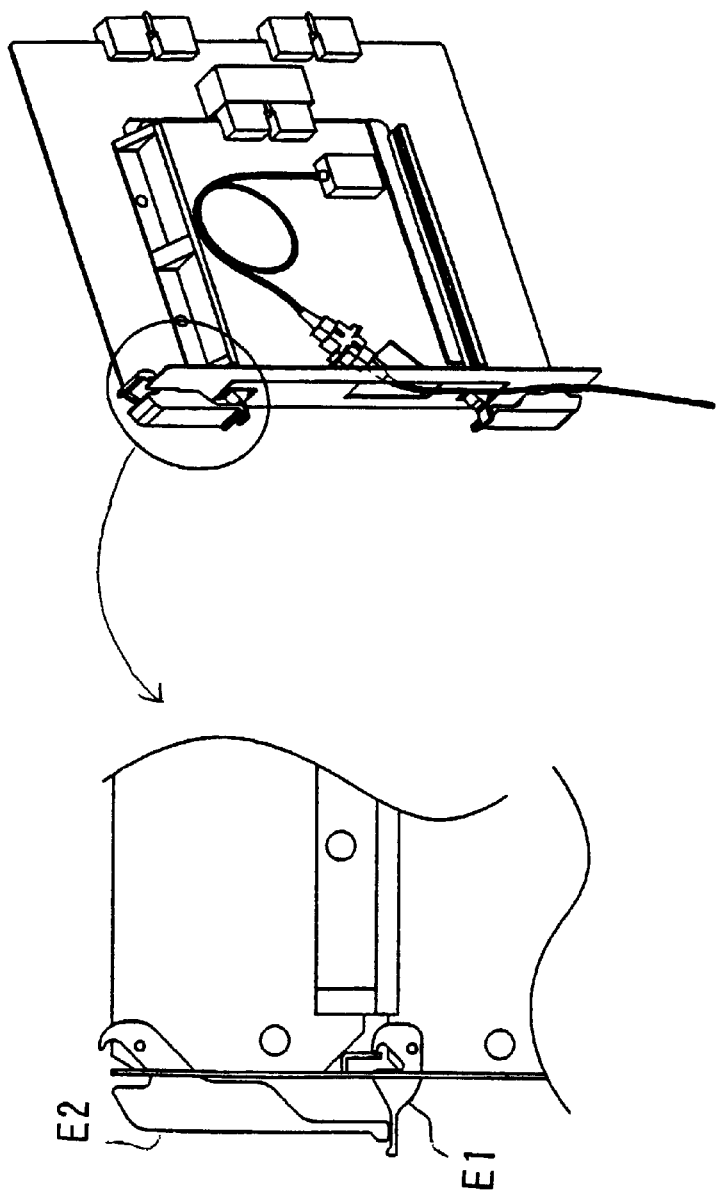
FIG. 7 is a view showing the mechanism of an ejector.

FIG. 7 is a view showing the mechanism of an ejector. FIG. 8 is a view showing the operation of the ejector. The main ejectors E2 for fixing the PIU unit 1 in the subrack 3 are located at the top and bottom of the front of the main printed circuit board 20. The subejectors E1 for fixing a sub-printed circuit board 10 to the main printed circuit board 20 are located at the top and bottom of the front of the sub-printed circuit board 10.

S1 in FIG. 8 is a schematic view of the main ejector E2 and subejector E1 at a time when the PIU unit 1 in which the sub-printed circuit board 10 is housed is mounted in the subrack 3.

In S2 in FIG. 8, the entire PIU unit 1 is pulled out of the subrack 3 when the main ejector E2 is rotated.

In S3 in FIG. 8, the main ejector E2 was rotated, so the subejector E1 becomes rotatable. The sub-printed circuit board 10 can be pulled out of the main printed circuit board 20 by rotating the subejector E1.

As stated above, when the engagement of the tip of the main ejector E2 with that of the subejector E1 is released by rotating the main ejector E2, the subejector E1 becomes rotatable. As a result, the sub-printed circuit board 10 cannot be pulled out without rotating the main ejector E2. This can prevent misoperation, such as line disconnection due to the sub-printed circuit board 10 being pulled out at the time of the PIU unit 1 being mounted in the subrack 3.

Figure 9:
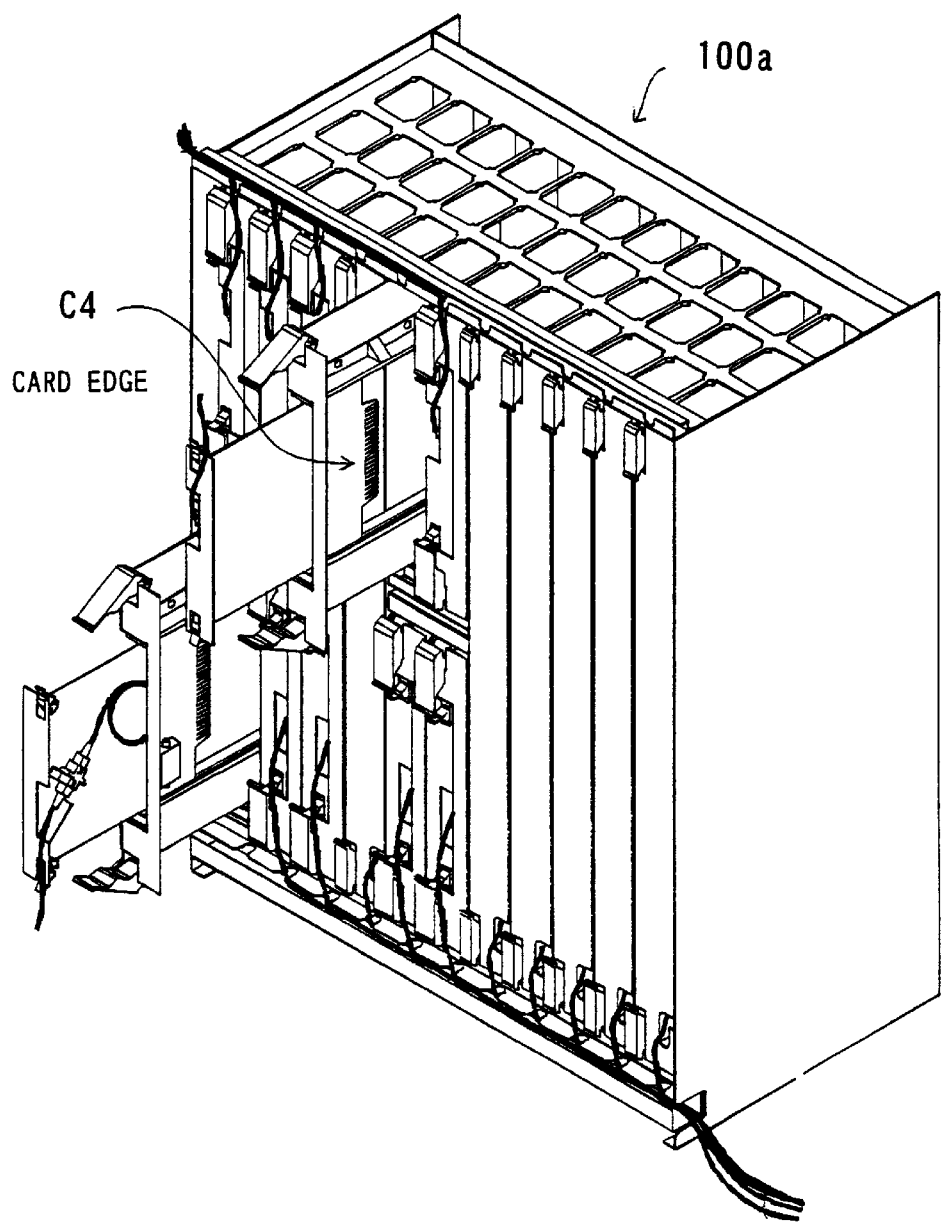
FIG. 9 is a view showing a modification of the transmission apparatus.

FIG. 9 is a view showing a modification of the transmission apparatus 100. In a transmission apparatus 100a, being a modification of the transmission apparatus 100, a card edge C4 is used to connect the sub-printed circuit board 10 and main printed circuit board 20. This card edge C4 will be used to connect the sub-printed circuit board 10 and main printed circuit board 20.

In the above transmission apparatus 100, the positions of the subconnector C2a and main connector C2b change, so the two guide rails G1 and G2 are used for the normal and reverse insertion. However, there is the card edge C4 in the transmission apparatus 10a, so one guide rail G is used for the normal and reverse insertion.

Now, switching operation from the normal insertion to the reverse insertion of the sub-printed circuit board 10 will be described. To reversely insert the sub-printed circuit board 10 inserted normally, a user first rotates the main ejectors E2 and pulls the PIU unit I out of the subrack 3. Then he/she rotates the subejectors E1 and pulls the sub-printed circuit board 10 out of the main printed circuit board 20 along the guide rail G1 on the main printed circuit board 20.

Then he/she inserts the sub-printed circuit board 10 reversely along the guide rail G2 with care for an optical fiber cable and fits the subconnector C2a into the main connector C2b. Finally he/she inserts the PIU unit 1 in which the sub-printed circuit board 10 is reversely housed into the subrack 3 again.

As described above, in the transmission apparatus 100 according to the present invention, the transmission unit 1 comprising the sub-printed circuit board 10 with the cable connector C1 located at a position which enables to introduce an optical fiber cable with a cable area minimized and without stress being applied to the optical fiber cable and the main printed circuit board 20 with the guide rail G along which the sub-printed circuit board 10 can be inserted reversely to change the direction from which the optical fiber cable is introduced is mounted in the subrack 3. This will give flexibility to structure for introducing optical fiber cables, resulting in greater convenience. Furthermore, signal transmission can be controlled efficiently.

Figure 10:
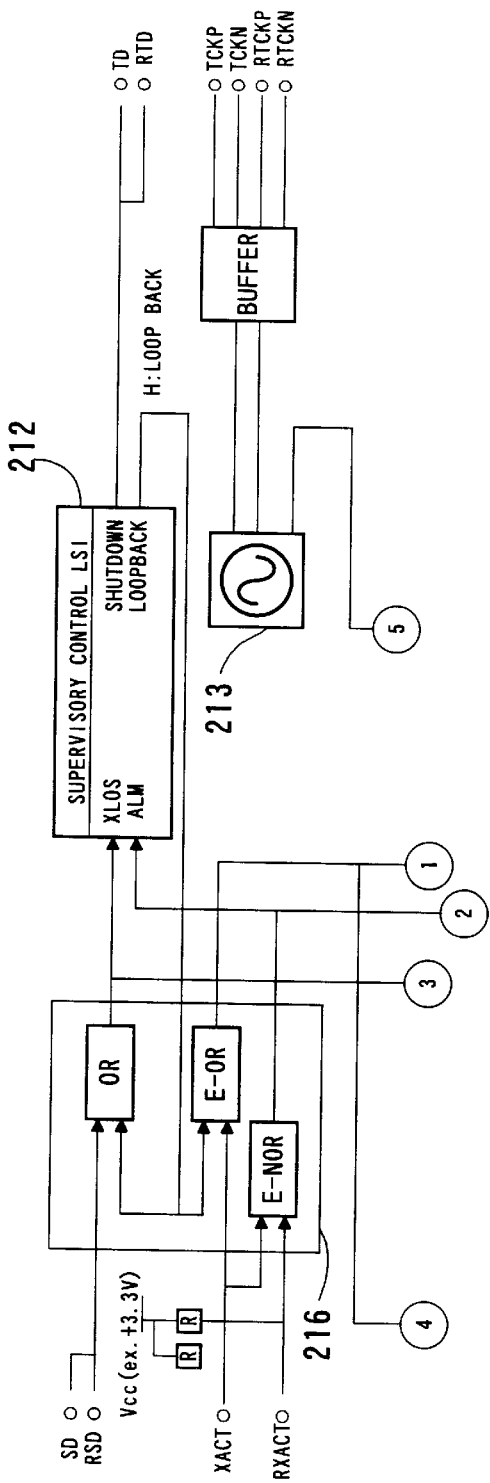
FIG. 10 is a view showing the structure of circuits on a main printed circuit board.
Figure 11:
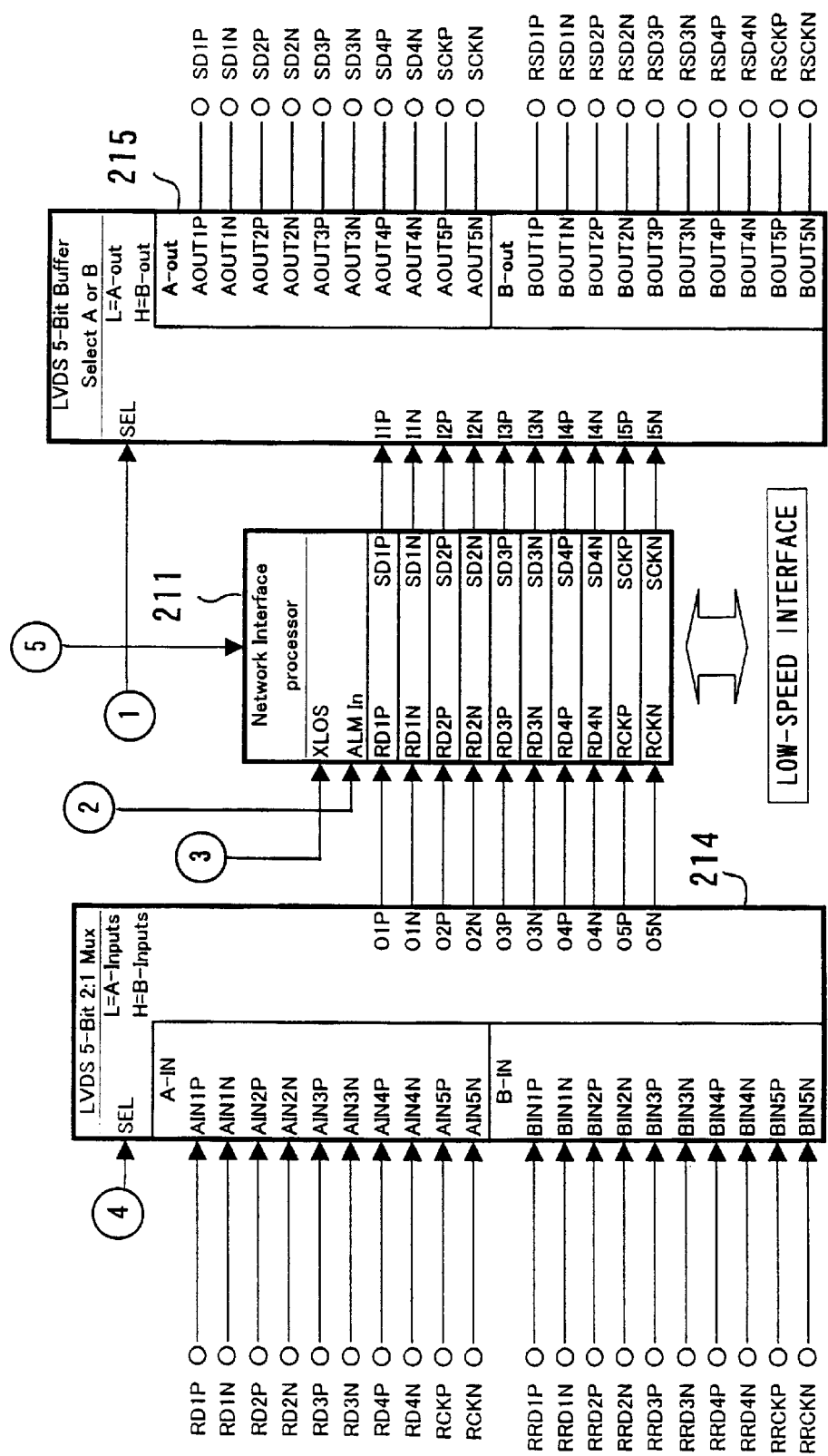
FIG. 11 is a view showing the structure of the circuits on the main printed circuit board.

The structure of circuits and signal connection in the transmission apparatus 100 (a first embodiment) will now be described. FIGS. 10 and 11 are views showing the structure of circuits on the main printed circuit board 20. Key circuit blocks on the main printed circuit board 20 include a main signal control LSI 211, a supervisory control LSI 212, a reference clock generating section 213, a 5-bit two-to-one selector 214, a 5-bit one-to-two buffer 215, and a inversion control section 216.

Figure 12:
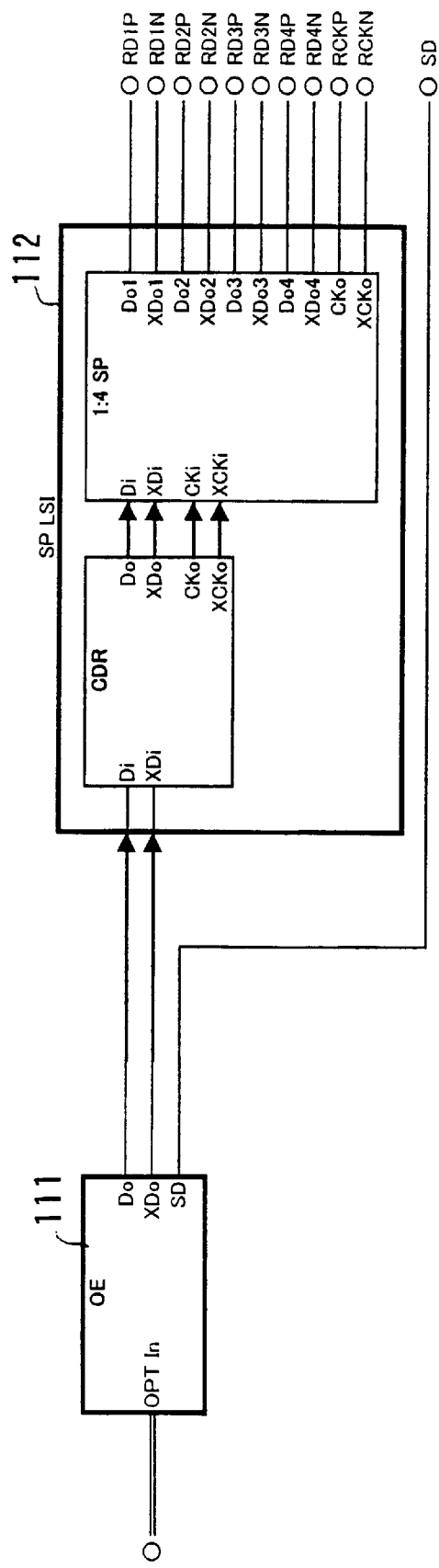
FIG. 12 is a view showing the structure of circuits on a sub-printed circuit board.
Figure 13:
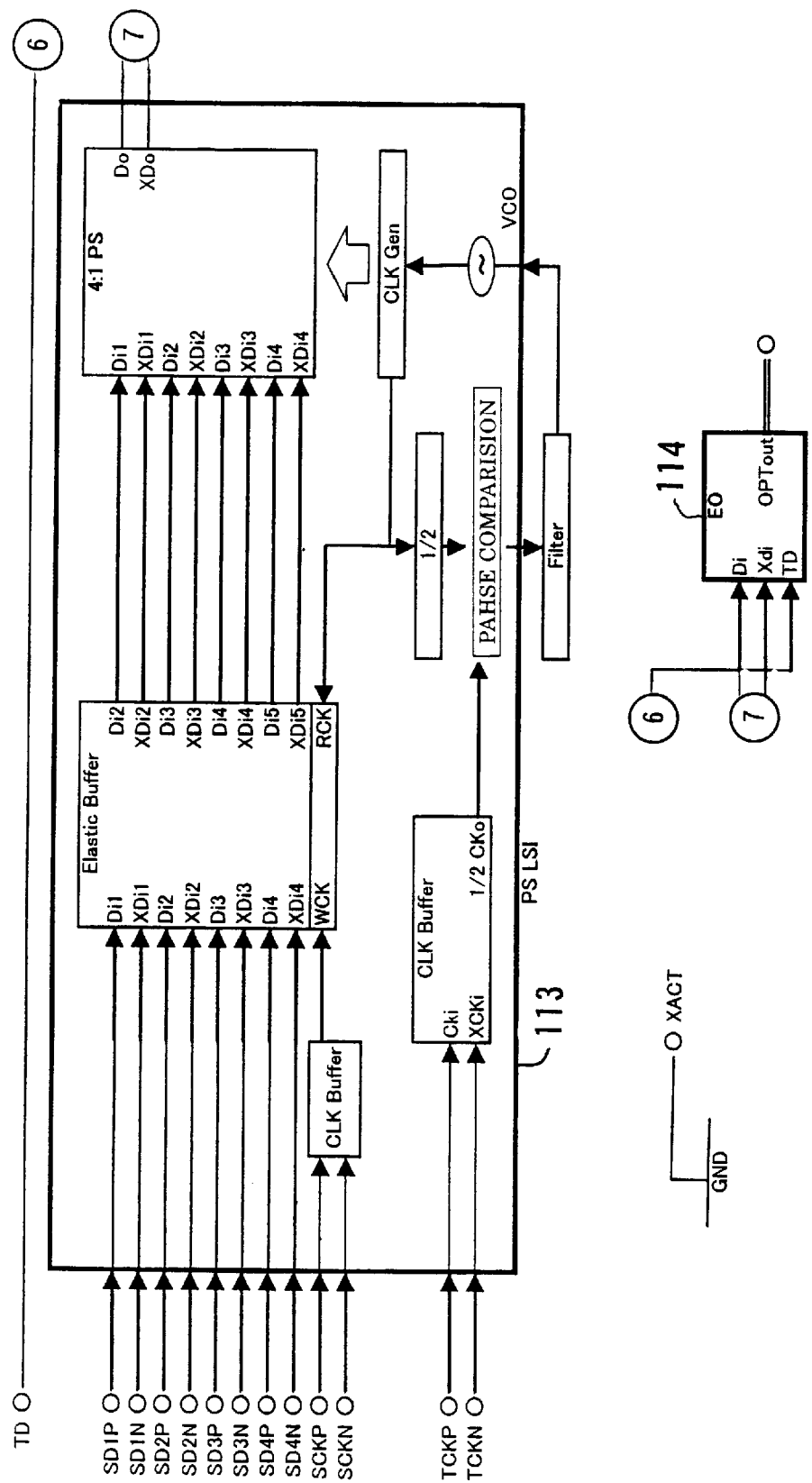
FIG. 13 is a view showing the structure of the circuits on the sub-printed circuit board.

FIGS. 12 and 13 are views showing the structure of circuits on the sub-printed circuit board 10. The sub-printed circuit board 10 includes an optical/electric (OE) section 111, a one-to-four serial/parallel (SP) LSI 112 with a built-in clock data recovery (CDR), a four-to-one parallel/serial (PS) LSI 113 with a built-in phase locked loop (PLL), and an electric/optical (EO) section 114.

Figure 16A:
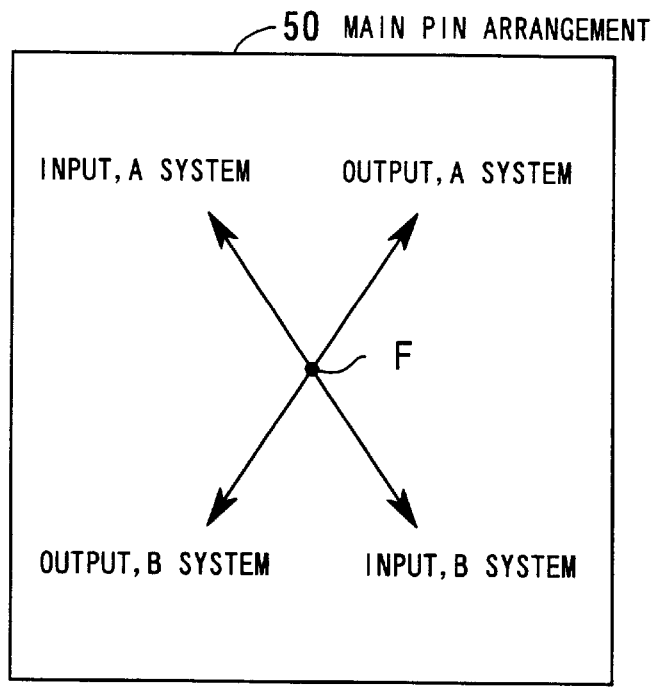
FIGS. 16(A) and 16(B) are views for describing the arrangement of pins.
Figure 16B:
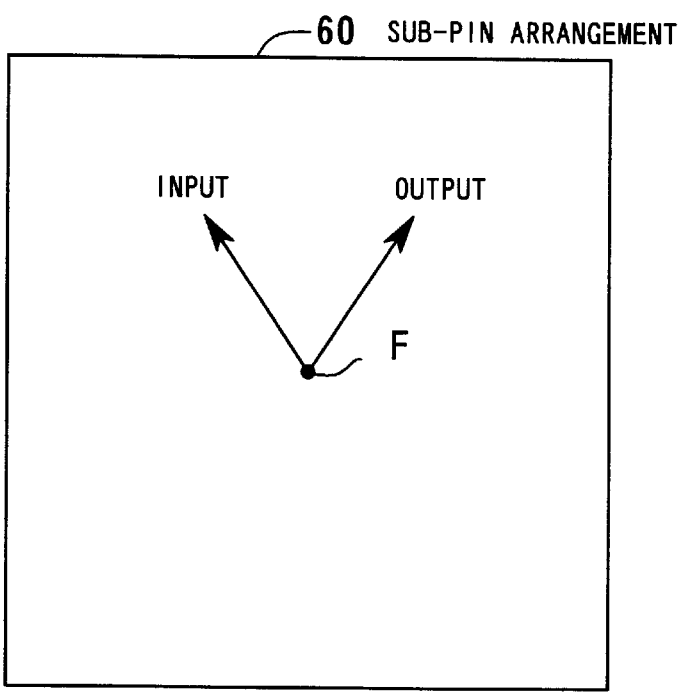

FIGS. 14 and 15 are views showing the arrangement of pins on connectors. FIG. 14 shows the arrangement of pins on the main connector C2b and FIG. 15 shows the arrangement of pins on the subconnector C2a. FIGS. 16(A) and 16(B) are views for describing the arrangement of the pins.

The main printed circuit board 20 has two circuit systems (with the same function) for each of input and output. These are a first system (A system) and a second system (B system). Transmission will be controlled by selecting a circuit system.

Therefore, signal connection pins on the main connector C2b will be arranged symmetrically with respect to point F shown in FIG. 16(A). In FIG. 16(A), input/A system, input/B system, output/A system, and output/B system are on the upper left, lower right, upper right, and lower left sides respectively. As shown in FIG. 16(B), with a sub-pin arrangement 60, there are signal connection pins only for one system.

When the sub-printed circuit board 10 is inserted normally into the main printed circuit board 20, the input/A system and output/A system circuits on the main printed circuit board 20 will operate. On the other hand, when the sub-printed circuit board 10 is inserted reversely into the main printed circuit board 20, the input/B system and output/B system circuits on the main printed circuit board 20 will operate. The arrangement of pins shown in FIGS. 14 and 15 are created on the basis of the pin arrangement forms shown in FIGS. 16(A) and 16(B).

How signals are connected in the case of the sub-printed circuit board 10 being inserted normally will now be described. The arrangements of pins on the main connector C2b and subconnector C2a are shown in FIGS. 14 and 15 respectively. When the sub-printed circuit board 10 is inserted normally, "RD1P" at No. 2 in column A on the main connector C2b is connected to "RD1P" at No. 2 in column A on the subconnector C2a. Similarly, Nos. 1 through 17 in columns A through E on the main connector C2b are connected to Nos. 1 through 17 in columns A through E, respectively, on the subconnector C2a.

Nos. 19, 21, 23, 25, 27, and 29 in columns A, B, D, and E and No. 18 in column D on the subconnector C2a are "empty," so Nos. 19, 21, 23, 25, 27, and 29 in columns A, B, D, and E and No. 18 in column D on the main connector C2b are open.

As a result, input to the selector 214 (FIG. 11) will be provided only at "A-IN" and "B-IN" is open. The output of the buffer 215 (FIG. 11) will also be provided only at "A-out" and "B-out" is open.

As shown in FIG. 13, "XACT" is connected to GND, so "XACT" in FIG. 10 is "L." "RXACT" in FIG. 10 is open, so it becomes "H" due to a pull-up resistor.

Usually output at "LOOPBACK" of the supervisory control LSI 212 (FIG. 10) is "L" and the output of an E-OR in the inversion control section 216 (FIG. 10) is "L."

Therefore, input at "SEL" of the selector 214 (FIG. 11) and at "SEL" of the buffer 215 (FIG. 11) is "L" and "A-IN" and "A-out" are selected. In this case, output at "B-out" of the buffer 215 should be stopped to reduce power consumption.

When the OE section 111 (FIG. 12) receives optical input, output at "SD" becomes "H." In addition, the OE section 111 outputs the optical input at "Do"/"XDo" as electric output. The electric output will be sent to the main printed circuit board 20 via the SP LSI 112 (FIG. 12) and connectors.

"A-IN" has been selected on the main printed circuit board 20. Therefore, the electric output passes through the selector 214 (FIG. 11), is processed by the main signal control LSI 211 (FIG. 11), and is sent to the low-speed side. Operation on the main printed circuit board 20 is in accordance with reference clock signals generated by the reference clock generating section 213.

A signal from a low-speed interface is processed by the main signal control LSI 211 and is output to the buffer 215 (FIG. 11). "A-out" has been selected, so the signal will be output only from the "A-out" side of the connector.

In order to use a clock signal generated by the reference clock generating section 213 on the sending side, there will be provided output from "TCKP"/"TCKN." "TD" is a signal for controlling optical output and is usually "L."

A signal which has been PS-converted by a ratio of four to one by the PS LSI 113 on the basis of the output of "A-out" on the main printed circuit board 20 and output at "TCKP"/"TCKN" is input to the EO section 114 (FIG. 13) and is output from the unit as optical output.

If there is no optical input to the unit, output at "SD" of the OE section 111 (FIG. 12) is "L" and "SD" in FIG. 10 is also "L." Input at "XLOS" of the main signal control LSI 211 and at "XLOS" of the supervisory control LSI 212 also becomes "L" by an OR in the inversion control section 216 (FIG. 10). This indicates that optical input is shut down. "SD" and "RSD" form a simple wired OR. However, if the sub-printed circuit board 10 is inserted normally, "RSD" is open. Therefore, a signal is direct-current and there is no problem.

To stop the optical output of the unit, "TD" and "RTD" should be changed to "H" by changing output at "SHUT-DWN" of the supervisory control LSI 212 to "H." By doing so, the optical output of the EO section 114 can be stopped. "TD" and "RTD" form a simple binary branch. However, if the sub-printed circuit board 10 is inserted normally, "RTD" is open. Therefore, a signal is direct-current and there is no problem.

How signals are connected in the case of the sub-printed circuit board 10 being inserted reversely will now be described. The arrangements of pins on the main connector C2b and subconnector C2a are shown in FIGS. 14 and 15 respectively. When the sub-printed circuit board 10 is inserted reversely, "RRD1P" at No. 29 in column E on the main connector C2b is connected to "RD1P" at No. 2 in column A (No. 29 in column E at the time of reversion) on the subconnector C2a.

Similarly, Nos. 14 through 30 in columns A through E on the main connector C2b are connected to Nos. 14 through 30 in columns A through E, respectively, on the subconnector C2a.

Nos. 19, 21, 23, 25, 27, and 29 in columns A, B, D, and E and No. 18 in column D on the subconnector C2a are "empty," so Nos. 2, 4, 6, 8, 10, and 12 in columns A, B, D, and E and No. 13 in column B on the main connector C2b are open. As a result, input to the selector 214 (FIG. 11) will be provided only at "B-IN" and "A-IN" is open. The output of the buffer 215 (FIG. 11) will also be provided only at "B-out" and "A-out" is open.

As shown in FIG. 13, "XACT" is connected to GND, so "RXACT" in FIG. 10 is "L." "XACT" in FIG. 10 is open, so it becomes "H" due to a pull-up resistor.

Usually output at "LOOPBACK" in FIG. 10 is "L" and the output of the E-OR in the inversion control section 216 is "H." Therefore, input at "SEL" of the selector 214 (FIG. 11) and at "SEL" of the buffer 215 (FIG. 11) is "H" and "B-IN" and "B-out" will be selected. In this case, the output of "A-out" of the buffer 215 (FIG. 11) should be stopped to reduce power consumption.

When the OE section 111 (FIG. 12) receives optical input, output at "SD" becomes "H." In addition, the OE section 111 outputs the optical input at "Do"/"XDo" as electric output. The electric output will be sent to the main printed circuit board 20 via the SP LSI 112 (FIG. 12) and connectors.

"B-in" has been selected on the main printed circuit board 20. Therefore, the electric output passes through the selector 214 (FIG. 11), is processed by the main signal control LSI 211 (FIG. 11), and is sent to the low-speed side. Operation on the main printed circuit board 20 is in accordance with reference clock signals generated by the reference clock generating section 213 (FIG. 10). A signal from a low-speed interface is processed by the main signal control LSI 211 (FIG. 11) and is output to the buffer 215 (FIG. 11). "B-out" has been selected, so the signal will be output only from the "B-out" side of the connector.

In order to use a clock signal generated by the reference clock generating section 213 (FIG. 10) on the sending side, output will be provided at "RTCKP"/"RTCKN." "RTD" is a signal for controlling optical output and is usually "L."

A signal which has been PS-converted by a ratio of four to one by the PS LSI 113 (FIG. 13) on the basis of the output of "B-out" on the main printed circuit board 20 and output at "RTCKP"/"RTCKN" is input to the EO section 114 (FIG. 13) and is output from the unit as optical output.

If there is no optical input to the unit, output at "SD" of the OE section 111 (FIG. 12) is "L" and "RSD" in FIG. 10 is "L." Input at "XLOS" of the main signal control LSI 211 (FIG. 11) and at "XLOS" of the supervisory control LSI 212 (FIG. 10) also becomes "L" by the OR in the inversion control section 216 (FIG. 10). This indicates that optical input is shut down.

To stop the optical output of the unit, "TD" and "RTD" should be changed to "H" by changing output at "SHUT-DWN" of the supervisory control LSI 212 (FIG. 10) to "H." By doing so, the optical output of the EO section 114 (FIG. 13) can be stopped. "TD" and "RTD" form a simple binary branch. However, if the sub-printed circuit board 10 is inserted reversely, "TD" is open. Therefore, a signal is direct-current and there is no problem.

How signals are connected in the case of the sub-printed circuit board 10 not being mounted or in the case of the sub-printed circuit board 10 being mismounted will now be described. The arrangement of pins on the main connector C2b is shown in FIG. 14. If the sub-printed circuit board 10 is inserted normally or reversely in the proper way, then one of "XACT" and "RXACT" in FIG. 10 becomes "L" and the other always becomes "H."

If the sub-printed circuit board 10 is not mounted, both of "XACT" and "RXACT" in FIG. 10 become "H" and the output of an E-NOR in the inversion control section 216 (FIG. 10) becomes "H." In this case, notification of alarm will be sent to the supervisory control LSI 212 (FIG. 10) and main signal control LSI 211 (FIG. 11).

If another sub-printed circuit board 10 is mismounted and both of "XACT" and "RXACT" in FIG. 10 become "L," notification of alarm will be sent in the same way.

Figure 17:
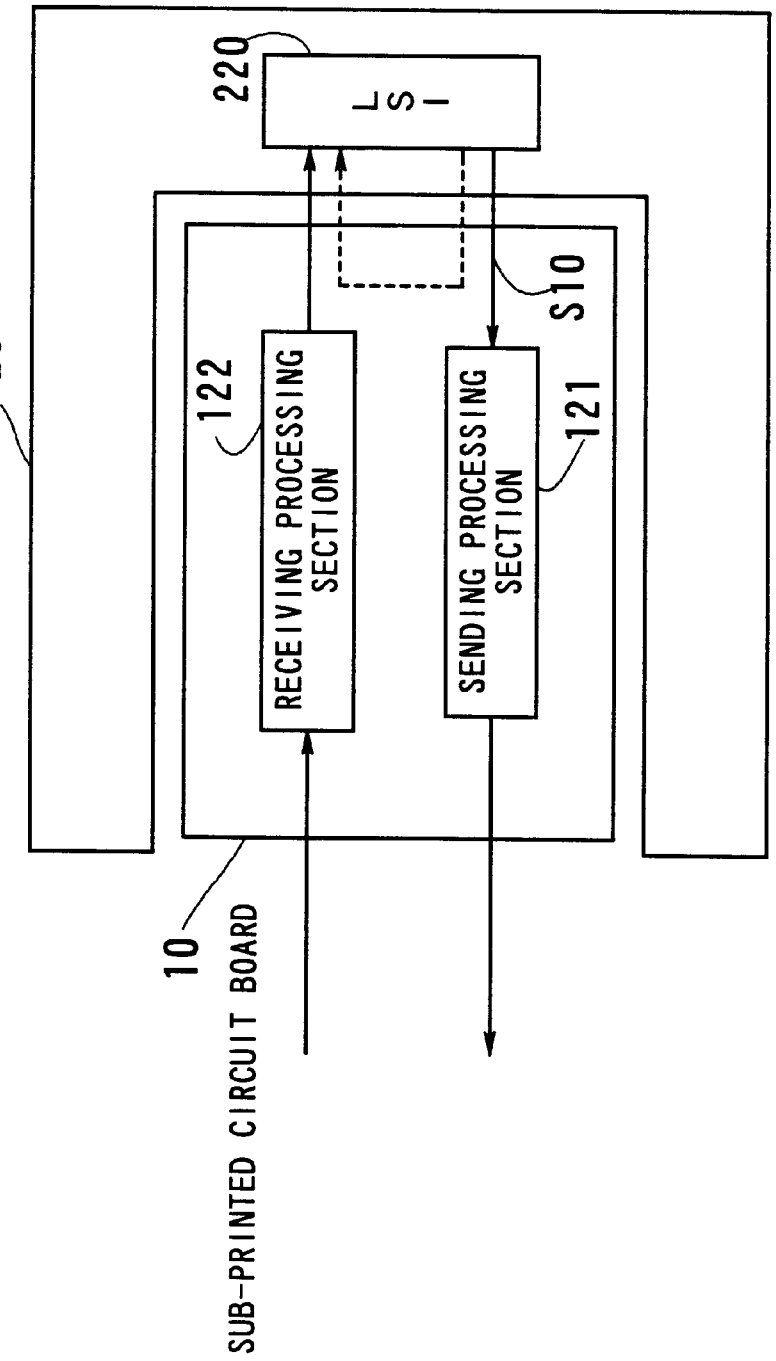
FIG. 17 is a view for describing loopback control.

How signals are connected at the time of loopback control will now be described. FIG. 17 is a view for describing loopback control. The sub-printed circuit board 10 has a sending processing section 121 and a receiving processing section 122. The main printed circuit board 20 has an LSI 220.

When the sub-printed circuit board 10 is inserted into the main printed circuit board 20, the LSI 220 processes a signal from the BWB and sends a signal S10 to the sending processing section 121. The sending processing section 121 PS-converts and EO-converts the signal S10 from the LSI 220 to generate an optical signal and sends it via an optical fiber cable. The receiving processing section 122 receives the optical signal sent via the optical fiber cable, OE-converts and SP-converts it to generate a parallel electrical signal, and sends it to the LSI 220.

To perform a test or evaluation on such structure, a target printed circuit board must be specified by separating the sub-printed circuit board 10 and the main printed circuit board 20.

Therefore, a loopback process is performed to cause the signal S10 from the LSI 220 to loop back on the sub-printed circuit board 10 and to input it to the main printed circuit board 20 again. By doing so, a test or evaluation can be performed efficiently.

FIGS. 18 and 19 are views each showing the arrangement of pins on a connector with a loopback taken into consideration. FIG. 18 shows the arrangement of pins on the main connector C2b and FIG. 19 shows the arrangement of pins on the subconnector C2a. FIG. 20 is a view showing connection for a loopback on the sub-printed circuit board 10.

For example, it is assumed that the sub-printed circuit board 10 is inserted normally. As described above, usually an "XACT" signal, an "RXACT" signal, and output at "LOOPBACK" are "L," "H," and "L" respectively. Therefore, in FIG. 11, "A-IN" of the selector 214 and "A-out" of the buffer 215 are selected and the main printed circuit board 20 and the sub-printed circuit board 10 are connected normally.

In this case, when output at "LOOPBACK" is changed to "H," the "XACT" signal of "L" is inverted by the E-OR in the inversion control section 216 and, in FIG. 11, "B-IN" of the selector 214 and "B-out" of the buffer 215 are selected. Moreover, regardless of the state of "SD," an alarm is masked by the OR in the inversion control section 216 to perform a loopback.

Signals from a low-speed interface are output at Nos. 21, 23, 25, 27, and 29 in columns A and B on the main connector C2b shown in FIG. 18 via the main signal control LSI 211 (FIG. 11) and "B-out" of the buffer 215 (FIG. 11).

Then the signals are input to Nos. 21, 23, 25, 27, and 29 in columns A and B on the subconnector C2a shown in FIG. 19. Connection on the sub-printed circuit board 10 is shown in FIG. 20. As a result, loopback outputting will be performed at Nos. 21, 23, 25, 27, and 29 in columns D and E on the sub-printed circuit board 10.

And then the signals are input to Nos. 21, 23, 25, 27, and 29 in columns D and E on the main connector C2b shown in FIG. 18, are input to the main signal control LSI 211 (FIG. 11) via "B-IN" of the selector 214, and are output to the low-speed interface.

By performing loopback control in this way, a test, evaluation, or the like can be performed only on the low-speed side without using the functions of the sub-printed circuit board 10 (inputting and outputting light, for example).

This is the same with a case where the sub-printed circuit board 10 is inserted reversely. That is to say, usually "B-IN" and "B-out" are selected. However, by changing output at "LOOPBACK" to "H," "A-IN" and "A-out" are selected and a loopback can be performed.

Figure 21:
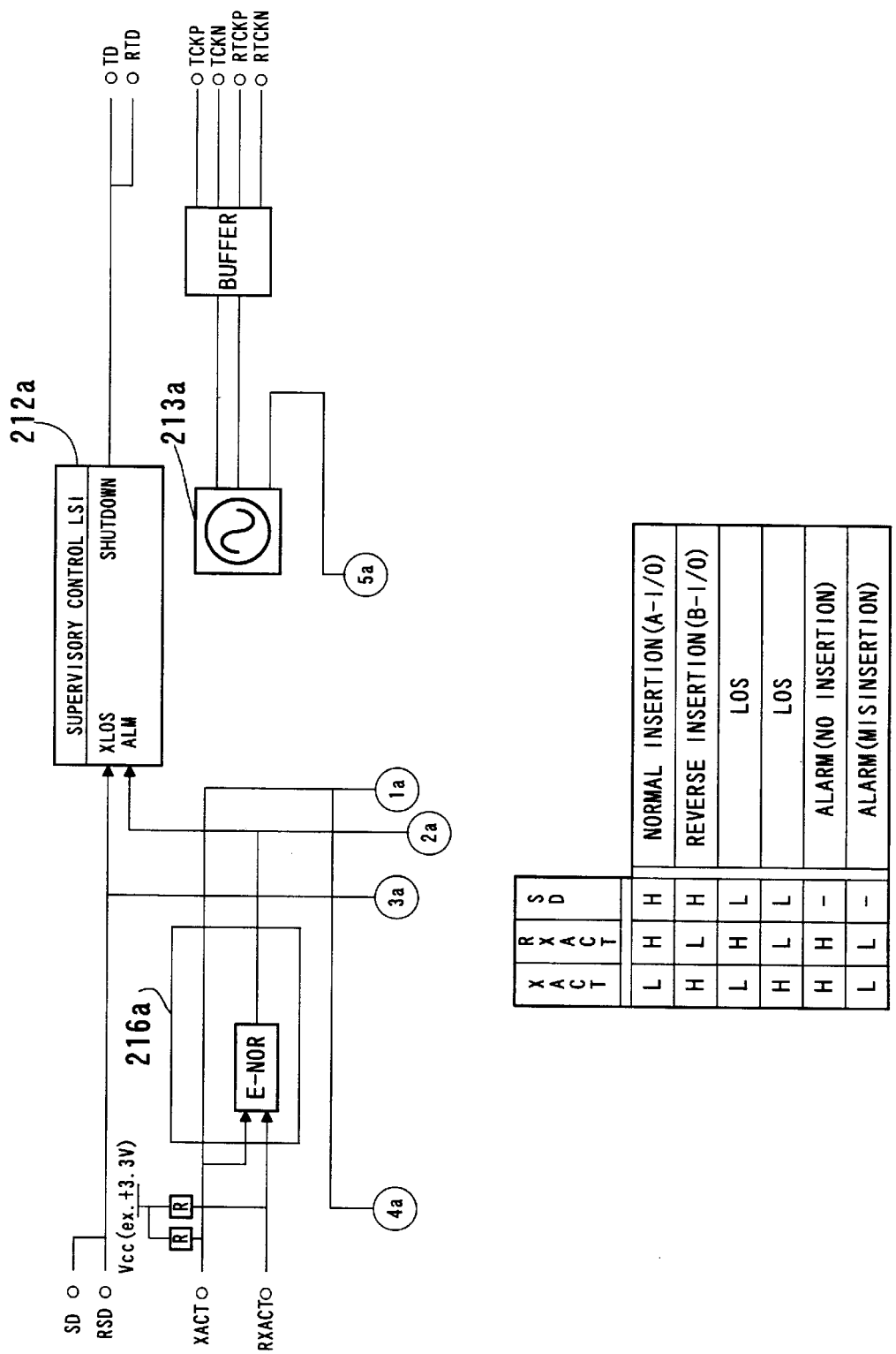
FIG. 21 is a view showing the structure of circuits on a main printed circuit board.
Figure 22:
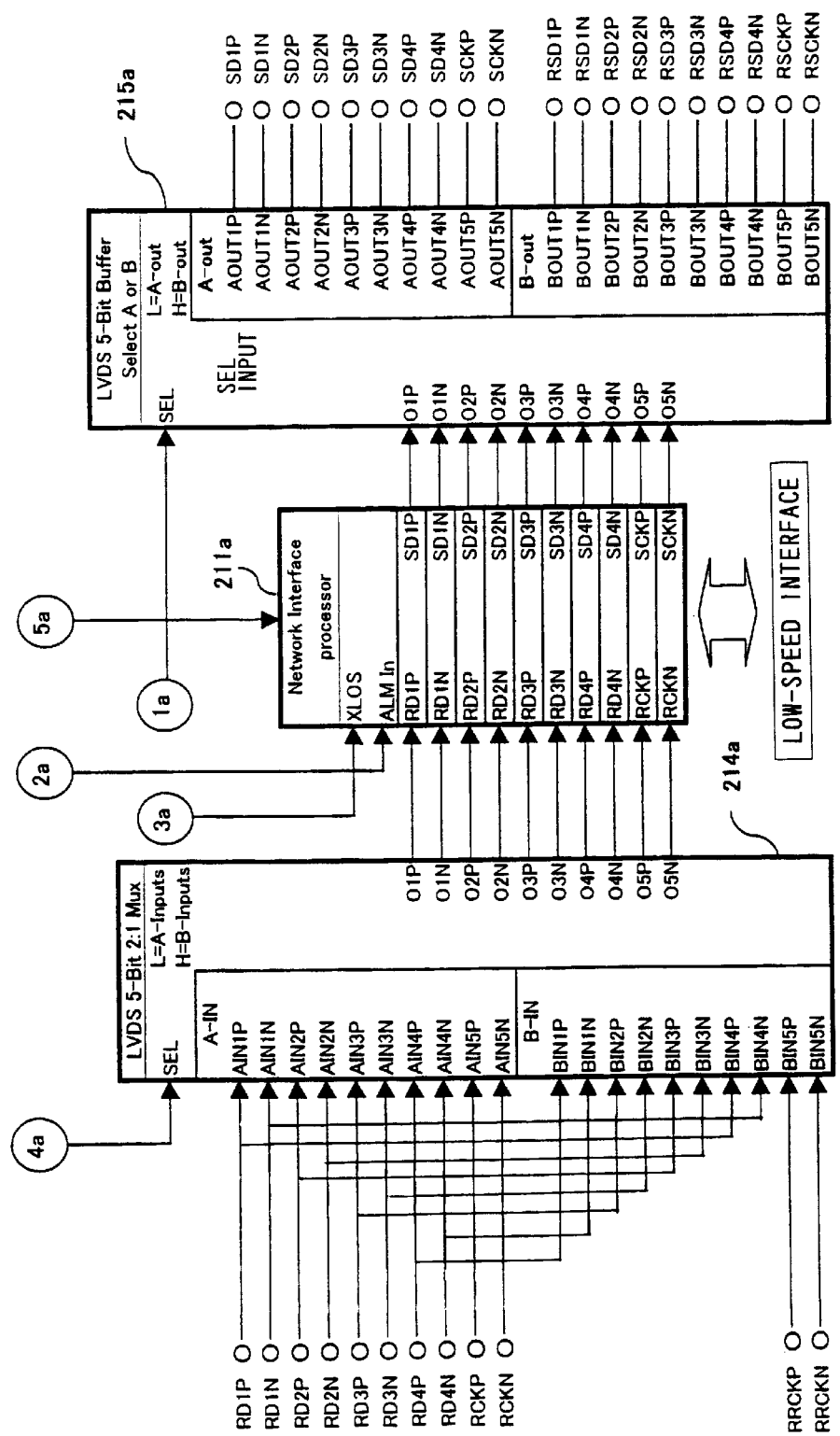
FIG. 22 is a view showing the structure of circuits on the main printed circuit board.

Now, a second embodiment of the structure of circuits and signal connection in the transmission apparatus 100 will be described. In the second embodiment, a connector with a smaller number of pins is taken into consideration. FIGS. 21 and 22 are views showing the structure of circuits on the main printed circuit board 20. Key circuit blocks on the main printed circuit board 20 include a main signal control LSI 211a, a supervisory control LSI 212a, a reference clock generating section 213a, a 5-bit two-to-one selector 214a, a 5-bit one-to-two buffer 215a, and a inversion control section 216a.

Figure 23:
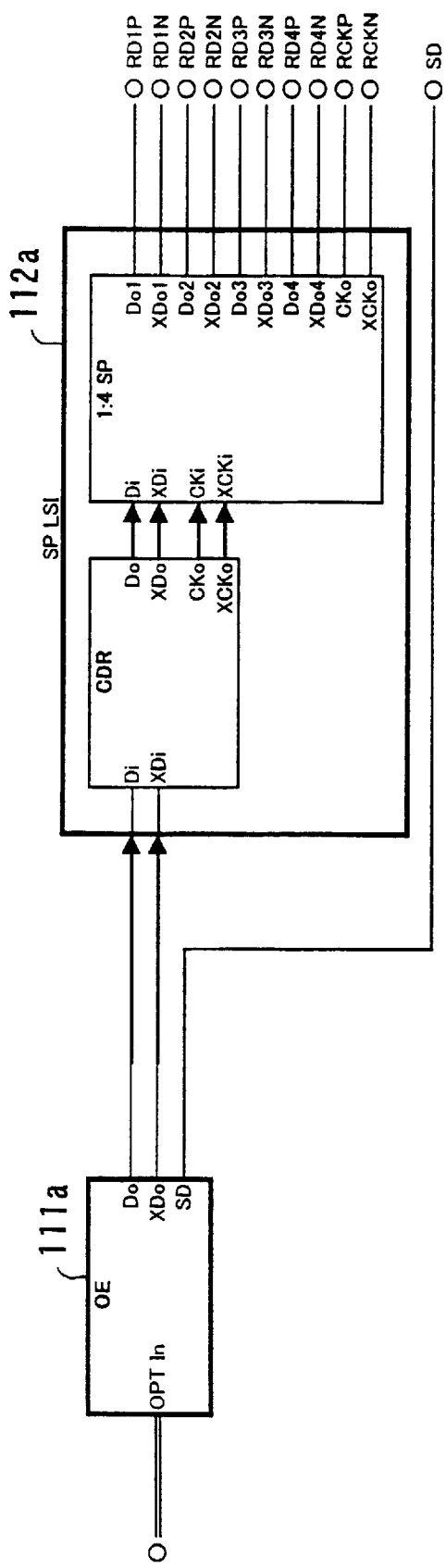
FIG. 23 is a view showing the structure of circuits on a sub-printed circuit board.
Figure 24:
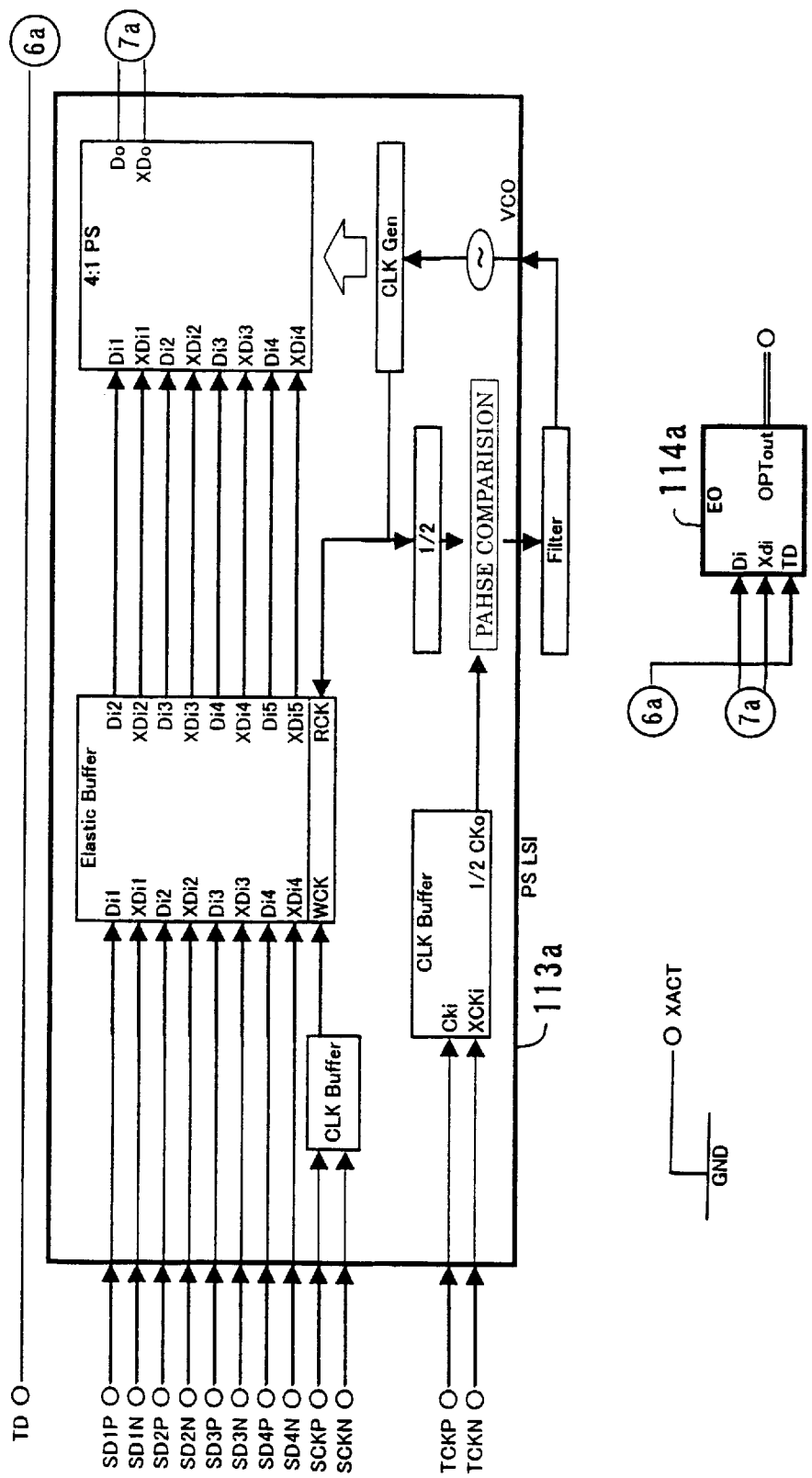
FIG. 24 is a view showing the structure of circuits on the sub-printed circuit board.
Figure 27:
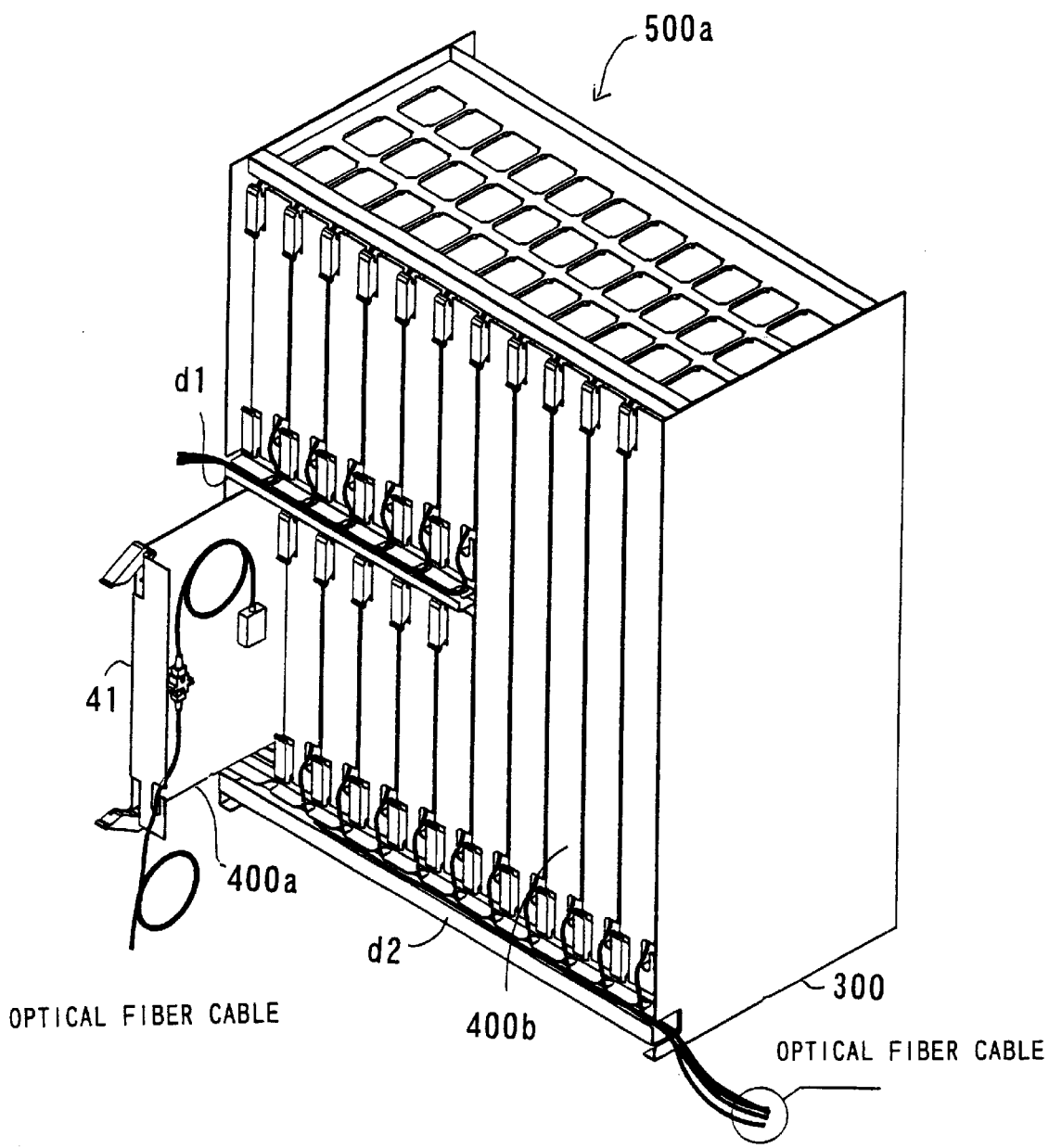
FIG. 27 is a schematic view of a conventional optical transmission apparatus.
Figure 28:
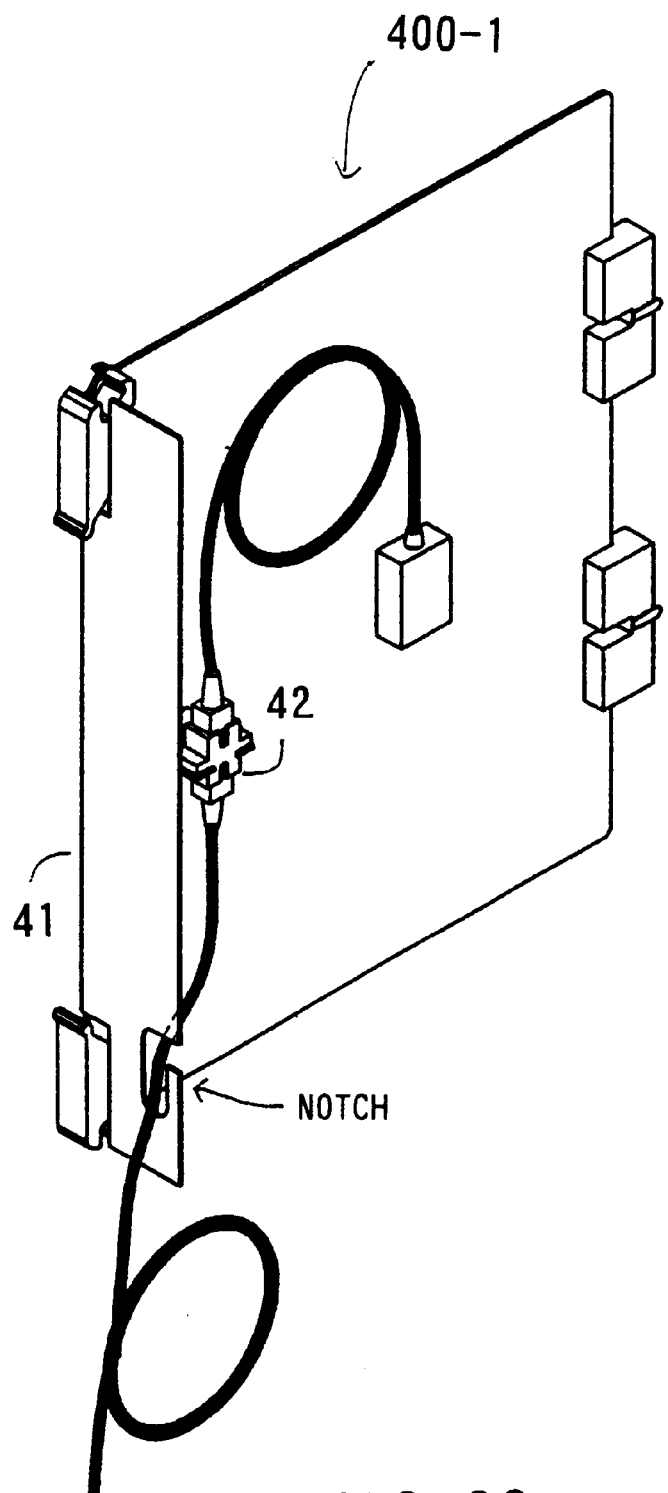
FIG. 28 is a schematic view of a PIU.
Figure 29:
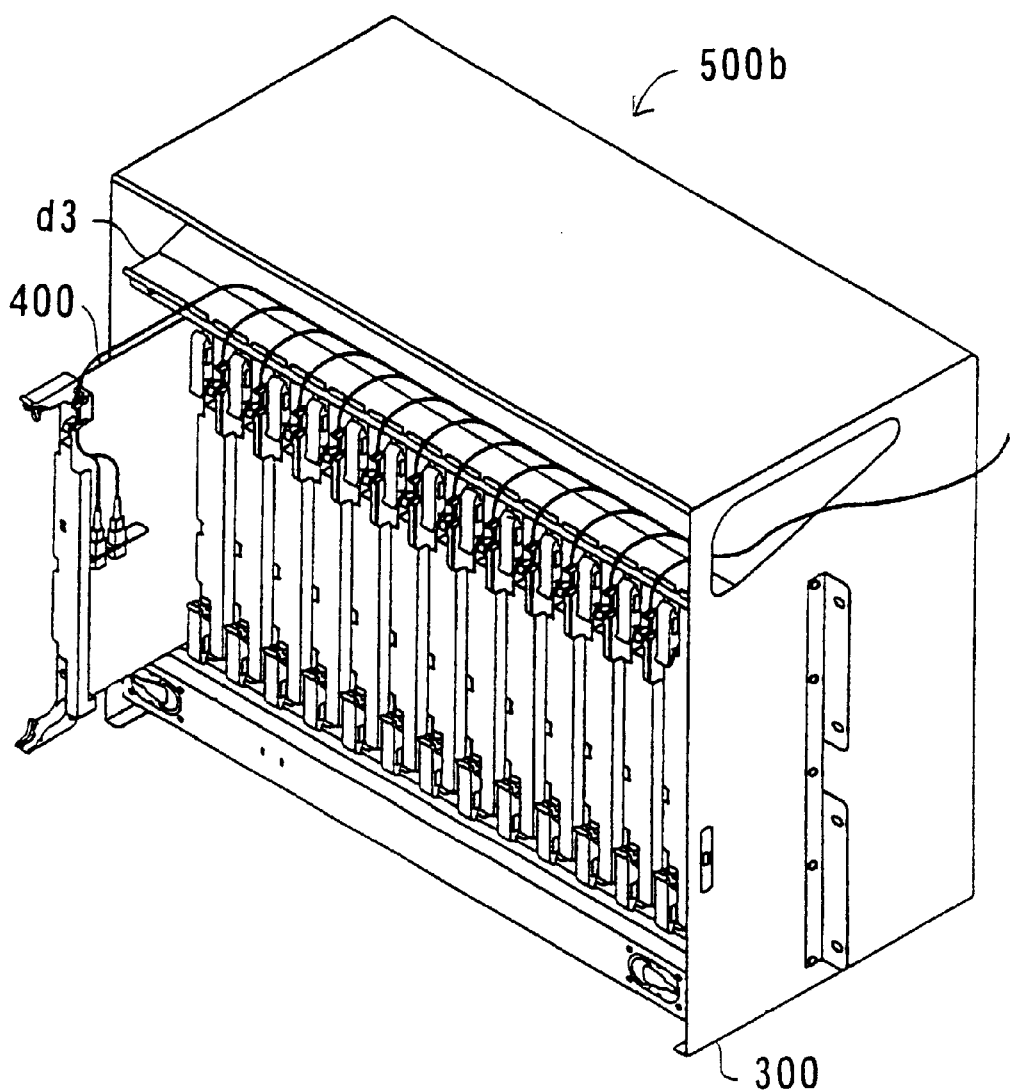
FIG. 29 is a schematic view of a conventional optical transmission apparatus.
Figure 30:
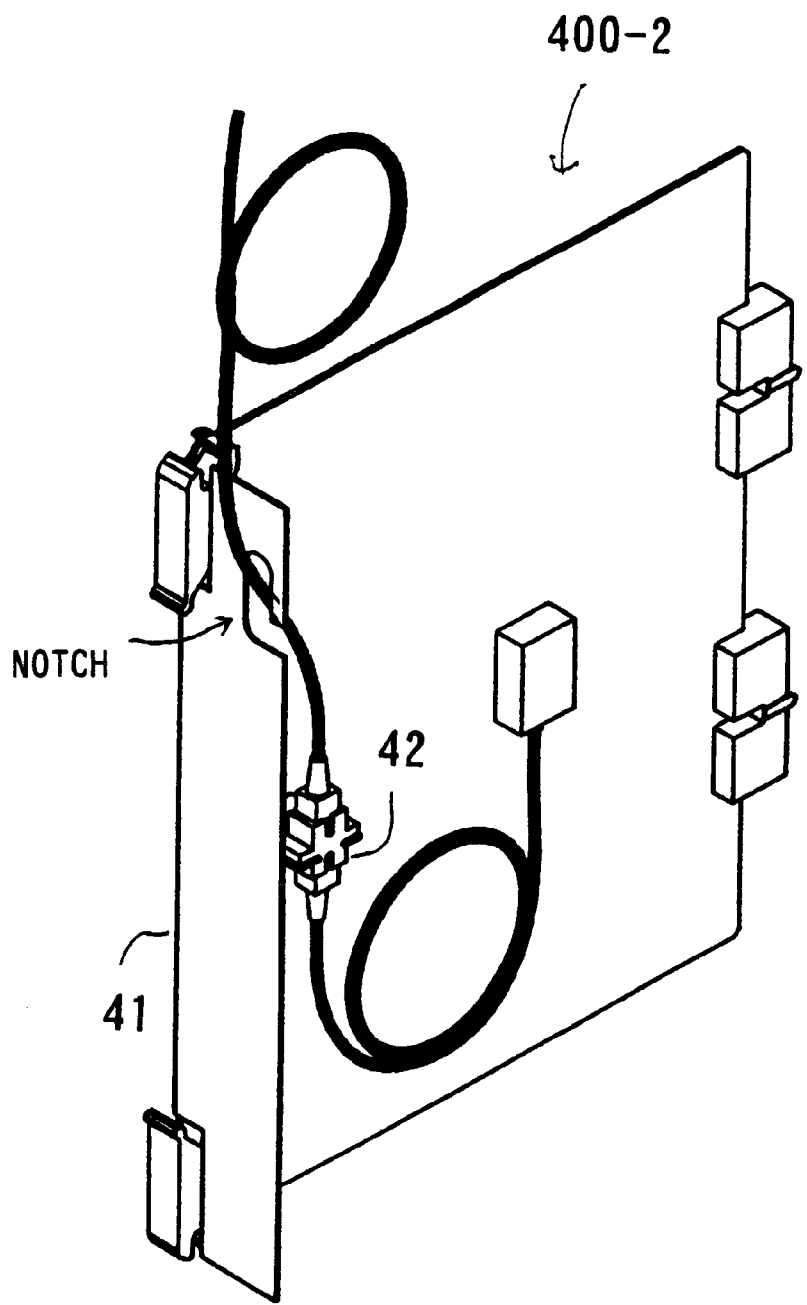
FIG. 30 is a schematic view of a PIU.
Figure 31A:
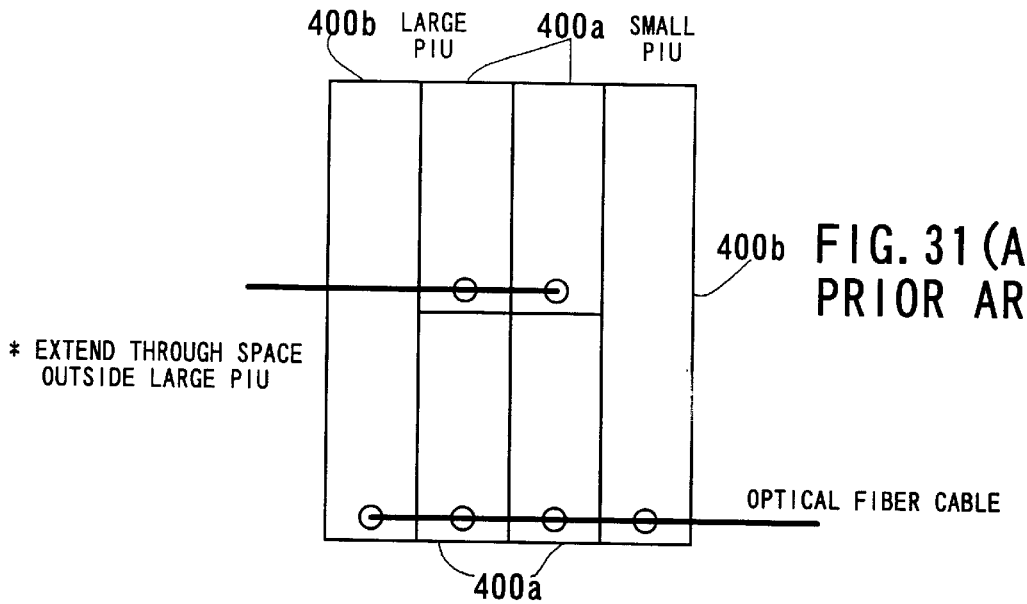
FIG. 31(A) and 31(B) are views showing problems with the related arts.
Figure 31B:
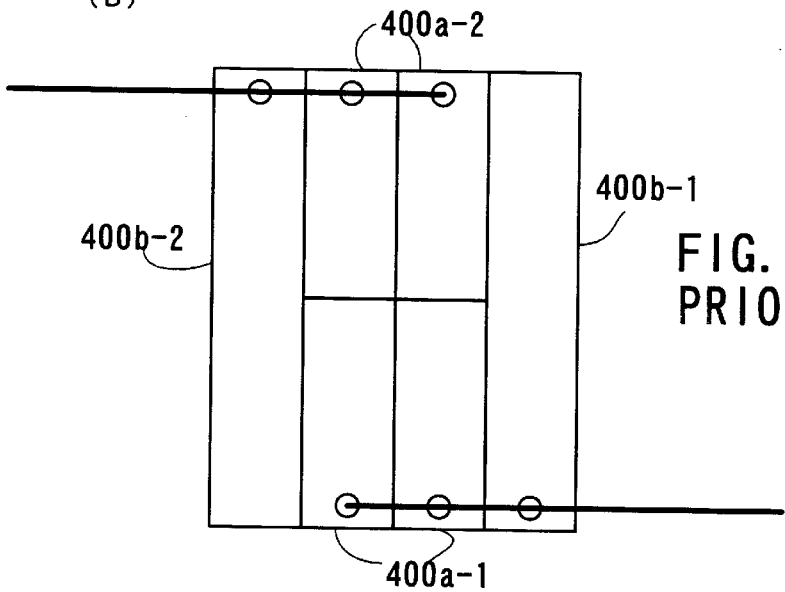

FIGS. 23 and 24 are views showing the structure of circuits on the sub-printed circuit board 10. The sub-printed circuit board 10 includes an OE section 111a, a one-to-four SP LSI 112a with a built-in CDR, a four-to-one PS LSI 113a with a built-in PLL, and an EO section 114a.

FIGS. 25 and 26 are views each showing the arrangement of pins on a connector. FIG. 25 shows the arrangement of pins on the main connector C2b and FIG. 26 shows the arrangement of pins on the subconnector C2a. How signals are connected in the case of the sub-printed circuit board 10 being inserted normally will now be described with reference to FIGS. 25 and 26.

When the sub-printed circuit board 10 is inserted normally, "SD1P" at No. 4 in column A on the main connector C2b is connected to "SD1P" at No. 4 in column A on the subconnector C2a. Similarly, Nos. 1 through 15 in columns A through E on the main connector C2b are connected to Nos. 1 through 15 in columns A through E, respectively, on the subconnector C2a.

Nos. 16, 18, 20, 22 and 24 in columns A, B, D, and E and No. 18 in column D on the subconnector C2a are "empty," so Nos. 16, 18, 20, 22 and 24 in columns A, B, D, and E on the main connector C2b are open.

As a result, "A-IN" on the input side of the selector 214a (FIG. 22), will be connected properly and "B-IN" will be connected reversely. The output of the buffer 215a (FIG. 22) will be provided only at "A-out" and "B-out" is open.

As shown in FIG. 24, "XACT" is connected to GND. Therefore, "XACT" in FIG. 21 is "L" and input at "SEL" of the selector 214a and at "SEL" of the buffer 215a is "L." As a result, "A-IN" and "A-out" are selected. In this case, output at "B-out" of the buffer 215a (FIG. 22) should be stopped to reduce power consumption.

When the OE section 111a (FIG. 23) receives optical input, output at "SD" becomes "H." In addition, the OE section 111a outputs the optical input at "Do/XDo" as electric output. The electric output will be sent to the main printed circuit board 20 via the SP LSI 112a (FIG. 23) and connectors.

"A-IN" has been selected on the main printed circuit board 20. Therefore, the electric output passes through the selector 214a (FIG. 22), is processed by the main signal control LSI 211*a* (FIG. 22), and is sent to the low-speed side. Operation on the main printed circuit board 20 is in accordance with reference clock signals generated by the reference clock generating section 213*a*.

A signal from a low-speed interface is processed by the main signal control LSI 211*a* (FIG. 22) and is output to the buffer 215*a*. "A-out" has been selected, so the signal will be output only from the "A-out" side of the connector.

In order to use a clock signal generated by the reference clock generating section 213*a* (FIG. 21) on the sending side, there will be provided output from "TCKP"/"TCKN." "TD" is a signal for controlling optical output and is usually "L." A signal which has been PS-converted by a ratio of four to one by the PS LSI 113*a* (FIG. 24) on the basis of the output of "A-out" on the main printed circuit board 20 and output at "TCKP"/"TCKN" is input to the EO section 114*a* (FIG. 24) and is output from the unit as optical output.

If there is no optical input to the unit, output at "SD" of the OE section 111*a* (FIG. 23) is "L" and input at "SD" in FIG. 21 is also "L." Input at "XLOS" of the main signal control LSI 211*a* (FIG. 22) and at "XLOS" of the supervisory control LSI 212*a* (FIG. 21) also becomes "L." This indicates that optical input is shut down. "SD" and "RSD" form a simple wired OR. However, if the sub-printed circuit board 10 is inserted normally, "RSD" is open. Therefore, a signal is direct-current and there is no problem.

To stop the optical output of the unit, "TD" and "RTD" should be changed to "H" by changing output at "SHUT-DWN" of the supervisory control LSI 212*a* (FIG. 21) to "H." By doing so, the optical output of the EO section 114*a* (FIG. 24) can be stopped.

"TD" and "RTD" form a simple binary branch. However, if the sub-printed circuit board 10 is inserted normally, "RTD" is open. Therefore, a signal is direct-current and there is no problem.

How signals are connected in the case of the sub-printed circuit board 10 being inserted reversely will now be described. The arrangements of pins on the main connector C2*b* and subconnector C2*a* are shown in FIGS. 25 and 26 respectively. When the sub-printed circuit board 10 is inserted reversely, "RSD1P" at No. 22 in column E on the main connector C2*b* is connected to "SD1P" at No. 4 in column A (No. 27 in column E at the time of reversion) on the subconnector C2*a*. Similarly, Nos. 12 through 25 in columns A through E on the main connector C2*b* are connected to Nos. 12 through 25 in columns A through E, respectively, on the subconnector C2*a*.

Nos. 16, 18, 20, 22, and 24 in columns A, B, D, and E on the subconnector C2*a* are "empty," so Nos. 2, 4, 6, 8, and 10 in columns A, B, D, and E on the main connector C2*b* are open. "RD1P" through "RD4N" at Nos. 12 and 14 in columns A, B, D, and E on the main connector C2*b* are used in both cases.

As a result, "A-IN" on the input side of the selector 214*a* (FIG. 22), will be connected reversely and "B-IN" will be connected properly. The output of the buffer 215*a* (FIG. 22) will be provided only at "B-out" and "A-out" is open.

"XACT" in FIG. 21 is open, so it becomes "H" due to a pull-up resistor. Input at "SEL" of the selector 214*a* (FIG. 22) and at "SEL" of the buffer 215*a* (FIG. 22) is "H" and "B-IN" and "B-out" will be selected. In this case, the output of "A-out" of the buffer 215*a* (FIG. 22) should be stopped to reduce power consumption.

When the OE section 111*a* (FIG. 23) receives optical input, output at "SD" becomes "H." In addition, the OE section 111*a* outputs the optical input at "Do"/"XDo" as electric output. The electric output will be sent to the main printed circuit board 20 via the SP LSI 112*a* (FIG. 23) and connectors.

"B-in" has been selected on the main printed circuit board 20. Therefore, the electric output passes through the selector 214*a* (FIG. 22), is processed by the main signal control LSI 211*a* (FIG. 22), and is sent to the low-speed side. Operation on the main printed circuit board 20 is in accordance with reference clock signals generated by the reference clock generating section 213*a* (FIG. 21).

A signal from a low-speed interface is processed by the main signal control LSI 211*a* (FIG. 22) and is output to the buffer 215*a* (FIG. 22). "B-out" has been selected, so the signal will be output only from the "B-out" side of the connector.

In order to use a clock signal generated by the reference clock generating section 213*a* (FIG. 21) on the sending side, output will be provided at "RTCKP"/"RTCKN." "RTD" is a signal for controlling optical output and is usually "L."

A signal which has been PS-converted by a ratio of four to one by the PS LSI 113*a* (FIG. 24) on the basis of the output of "B-out" on the main printed circuit board 20 and output at "RTCKP"/"RTCKN" is input to the EO section 114*a* (FIG. 24) and is output from the unit as optical output.

If there is no optical input to the unit, output at "SD" of the OE section 111*a* (FIG. 23) is "L" and "RSD" in FIG. 21 is "L." Input at "XLOS" of the main signal control LSI 211*a* (FIG. 22) and at "XLOS" of the supervisory control LSI 212*a* (FIG. 21) also becomes "L." This indicates that optical input is shut down.

To stop the optical output of the unit, "TD" and "RTD" should be changed to "H" by changing output at "SHUT-DWN" of the supervisory control LSI 212*a* (FIG. 21) to "H." By doing so, the optical output of the EO section 114*a* (FIG. 24) can be stopped.

"TD" and "RTD" form a simple binary branch. However, if the sub-printed circuit board 10 is inserted reversely, "TD" is open. Therefore, a signal is direct-current and there is no problem.

How signals are connected in the case of the sub-printed circuit board 10 not being mounted or in the case of the sub-printed circuit board 10 being mismounted will now be described. The arrangements of pins on the connectors are shown in FIGS. 25 and 26. If the sub-printed circuit board 10 is inserted normally or reversely in the proper way, then one of "XACT" and "RXACT" in FIG. 21 becomes "L" and the other always becomes "H."

If the sub-printed circuit board 10 is not mounted, both of "XACT" and "RXACT" in FIG. 21 become "H" and the output of the E-NOR in the inversion control section 216*a* (FIG. 21) becomes "H." In this case, notification of alarm will be sent to the supervisory control LSI 212*a* (FIG. 21) and main signal control LSI 211*a* (FIG. 22).

If another sub-printed circuit board 10 is mismounted and both of "XACT" and "RXACT" in FIG. 21 become "L," notification of alarm will be sent in the same way.

The effects of the transmission apparatus 100 according to the present invention will now be described. With the transmission apparatus 100 and transmission unit 1 according to the present invention, even one type of PIUs will make it possible to introduce cables from the lower or upper portion of the front of a subrack. This enables to determine the layout of PIUs freely. Furthermore, there is no limit on the layout of PIUs, so wirings on BWBs become ideal. As a result, the number of BWB layers can be reduced by twenty percent (from twenty layers to sixteen layers, for example).

Moreover, even one type of PIUs will make it possible to pull out cables from the lower or upper portion of the front of a subrack, resulting in easiness of design, manufacture, maintenance, and management. In addition, a cable will be introduced into a PIU from the outside at an acute angle to the front of the PIU, so cables can be bunched in a small area in front of PIUs.

Furthermore, inserting the sub-printed circuit board 10 reversely into the main printed circuit board 20 can provide other functions to the sub-printed circuit board 10. Again a rail along which the sub-printed circuit board 10 is inserted into the main printed circuit board 20 is limited. This prevents mismounting.

Conventionally, the loopback function on the low-speed side has been limited by the number of pins or patterns, so it has been difficult to realize the function. By using a circuit according to the present invention, however, the loopback function on the low-speed side can be realized easily. In addition, by using pins on an electric connector, which connects the main printed circuit board 20 and sub-printed circuit board 10, common to the normal and reverse insertion for sending or receiving, the number of pins can be reduced by twenty-five percent.

The above descriptions have been given with an optical fiber cable as an external cable. However, the present invention is also applicable to a case where an electric cable, such as a coaxial cable, is introduced.

As has been described in the foregoing, a transmission apparatus according to the present invention comprises transmission units each including a sub-printed circuit board with a cable connector and a main printed circuit board with a guide rail along which the sub-printed circuit board can be inserted reversely to change the direction from which an optical fiber cable is introduced and an enclosure with ducts for bunching cables. This will give flexibility to structure for introducing external cables and enable efficient control of signal transmission.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A transmission apparatus for controlling signal transmission by introducing cables, the apparatus comprising:
    transmission units each including:
        a sub-printed circuit board on which a cable connector for introducing the cable from the outside is fixed; and
        a main printed circuit board with a guide rail along which the sub-printed circuit board can be inserted reversely to change the direction from which the cable is introduced at the time of the sub-printed circuit board being housed; and
    an enclosure with ducts for bunching the cables in which the transmission units are mounted.

2. The transmission apparatus according to claim 1, wherein the main printed circuit board includes a first guide rail for changing the direction of the cable connector to a first direction at the time of the sub-printed circuit board being inserted normally and a second guide rail for changing the direction of the cable connector to a second direction at the time of the sub-printed circuit board being inserted reversely as the guide rail.

3. The transmission apparatus according to claim 2, wherein the first guide rail with an upper and lower rail having different groove widths and the second guide rail with an upper and lower rail having groove widths being reverse to the groove widths of the rails in the first guide rail are formed on the main printed circuit board, further wherein the sides of the sub-printed circuit board along the guide rails have thicknesses which fit into the groove widths of the rails in the first guide rail to prevent the misinsertion of the sub-printed circuit board into the main printed circuit board.

4. The transmission apparatus according to claim 2, wherein the first guide rail and the second guide rail being different in rail length from each other are formed on the main printed circuit board, further wherein the misinsertion of the sub-printed circuit board into the main printed circuit board is prevented by making a notch in one of the sides of the sub-printed circuit board along the guide rails.

5. The transmission apparatus according to claim 1, wherein a main ejector is located on the main printed circuit board and a subejector is located on the sub-printed circuit board, further wherein the subejector rotates by rotating the main ejector and by releasing the engagement of the tip of the main ejector with the tip of the subejector.

6. The transmission apparatus according to claim 1, wherein the transmission unit includes loopback means for causing a signal from the main printed circuit board to loop back on the sub-printed circuit board and for inputting the signal to the main printed circuit board again.

7. The transmission apparatus according to claim 1, wherein the main printed circuit board includes alarm generating means for outputting an alarm in the case of an improper printed circuit board being inserted.

8. The transmission apparatus according to claim 1, wherein one pin connected to GND indicates the direction of the sub-printed circuit board inserted into the main printed circuit board.

9. The transmission apparatus according to claim 1, wherein, in a main pin arrangement, being the arrangement of pins on a connector on the main printed circuit board, signal connection pins for a first and second system are symmetrical with respect to the center of the pin arrangement and, in a sub-pin arrangement, being the arrangement of pins on a connector on the sub-printed circuit board, there are signal connection pins only for one system.

10. The transmission apparatus according to claim 9, wherein if the number of pins is small, the main pin arrangement and the sub-pin arrangement set pins used in both of a case where the sub-printed circuit board is inserted normally and a case where the sub-printed circuit board is inserted reversely.

11. A transmission unit for controlling signal transmission by introducing a cable, the unit comprising:
    sub-printed circuit board on which a cable connector for introducing the cable from the outside is fixed; and
    a main printed circuit board with a guide rail along which the sub-printed circuit board can be inserted reversely to change the direction from which the cable is introduced at the time of the sub-printed circuit board being housed.

12. The transmission unit according to claim 11, wherein the main printed circuit board includes a first guide rail for changing the direction of the cable connector to a first direction at the time of the sub-printed circuit board being inserted normally and a second guide rail for changing the direction of the cable connector to a second direction at the time of the sub-printed circuit board being inserted reversely as the guide rail.

13. The transmission unit according to claim 12, wherein the first guide rail with an upper and lower rail having different groove widths and the second guide rail with an upper and lower rail having groove widths being reverse to the groove widths of the rails in the first guide rail are formed on the main printed circuit board, further wherein the sides of the sub-printed circuit board along the guide rails have thicknesses which fit into the groove widths of the rails in the first guide rail to prevent the misinsertion of the sub-printed circuit board into the main printed circuit board.

14. The transmission unit according to claim 12, wherein the first guide rail and the second guide rail being different in rail length from each other are formed on the main printed circuit board, further wherein the misinsertion of the sub-printed circuit board into the main printed circuit board is prevented by making a notch in one of the sides of the sub-printed circuit board along the guide rails.

15. The transmission unit according to claim 11, wherein a main ejector is located on the main printed circuit board and a subejector is located on the sub-printed circuit board, further wherein the subejector rotates by rotating the main ejector and by releasing the engagement of the tip of the main ejector with the tip of the subejector.

16. The transmission unit according to claim 11, further comprising loopback means for causing a signal from the main printed circuit board to loop back on the sub-printed circuit board and for inputting the signal to the main printed circuit board again.

17. The transmission unit according to claim 11, wherein the main printed circuit board includes alarm generating means for outputting an alarm in the case of an improper printed circuit board being inserted.

18. The transmission unit according to claim 11, wherein one pin connected to GND indicates the direction of the sub-printed circuit board inserted into the main printed circuit board.

19. The transmission unit according to claim 11, wherein, in a main pin arrangement, being the arrangement of pins on a connector on the main printed circuit board, signal connection pins for a first and second system are symmetrical with respect to the center of the pin arrangement and, in a sub-pin arrangement, being the arrangement of pins on a connector on the sub-printed circuit board, there are signal connection pins only for one system.

20. The transmission unit according to claim 19, wherein if the number of pins is small, the main pin arrangement and the sub-pin arrangement set pins used in both of a case where the sub-printed circuit board is inserted normally and a case where the sub-printed circuit board is inserted reversely.

* * * * *